(12) United States Patent
Suehiro et al.

(10) Patent No.: US 7,429,750 B2
(45) Date of Patent: Sep. 30, 2008

(54) SOLID-STATE ELEMENT AND SOLID-STATE ELEMENT DEVICE

(75) Inventors: Yoshinobu Suehiro, Aichi-ken (JP); Seiji Yamaguchi, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 478 days.

(21) Appl. No.: 11/085,613

(22) Filed: Mar. 22, 2005

(65) Prior Publication Data

US 2005/0211997 A1 Sep. 29, 2005

(30) Foreign Application Priority Data

| Mar. 23, 2004 | (JP) | ............................. 2004-084282 |
| Jul. 30, 2004 | (JP) | ............................. 2004-223600 |
| Feb. 21, 2005 | (JP) | ............................. 2005-044649 |

(51) Int. Cl.
*H01L 29/04* (2006.01)
*H01L 21/00* (2006.01)

(52) U.S. Cl. ............................. 257/53; 257/72; 257/79; 257/222; 257/225; 257/E27.001; 438/24; 438/26; 438/28

(58) Field of Classification Search ................ 257/53, 257/72, 79–84, 88, 222, 225, 290, 414, 431; 438/22, 48, 24, 26, 28
See application file for complete search history.

(56) References Cited

U.S. PATENT DOCUMENTS

2004/0217369 A1* 11/2004 Nitta et al. ..................... 257/99

FOREIGN PATENT DOCUMENTS

| JP | 11-150297 | 6/1999 |
| JP | 2004-179365 | 6/2004 |

* cited by examiner

*Primary Examiner*—Hsien-ming Lee
(74) *Attorney, Agent, or Firm*—McGinn IP Law Group, PLLC

(57) ABSTRACT

A solid-state element has: a semiconductor layer formed on a substrate, the semiconductor layer having a first layer that corresponds to an emission area of the solid-state element to and a second layer through which current is supplied to the first layer; a light discharge surface through which light emitted from the first layer is externally discharged, the light discharge surface being located on the side of the substrate; and an electrode having a plurality of regions that are of a conductive material and are in ohmic-contact with the second layer.

14 Claims, 15 Drawing Sheets

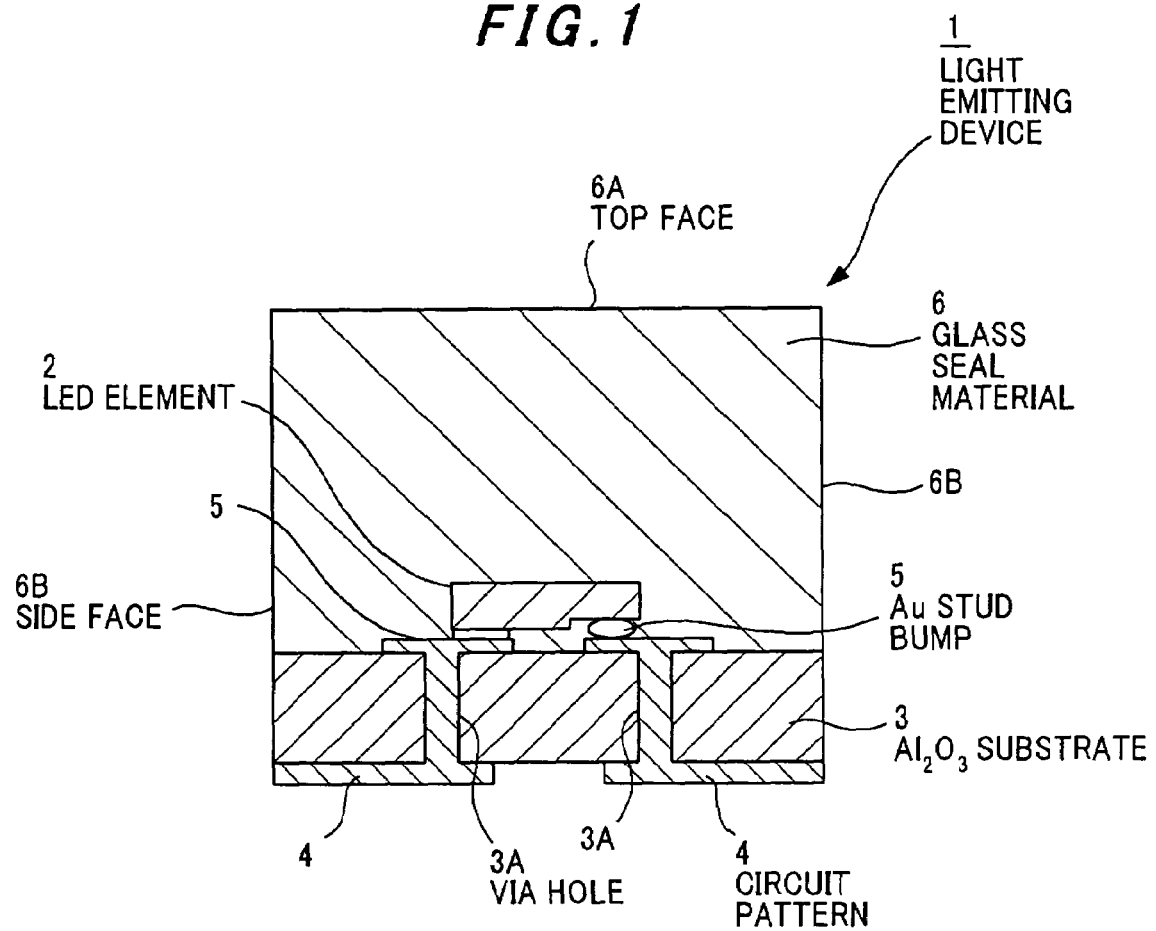

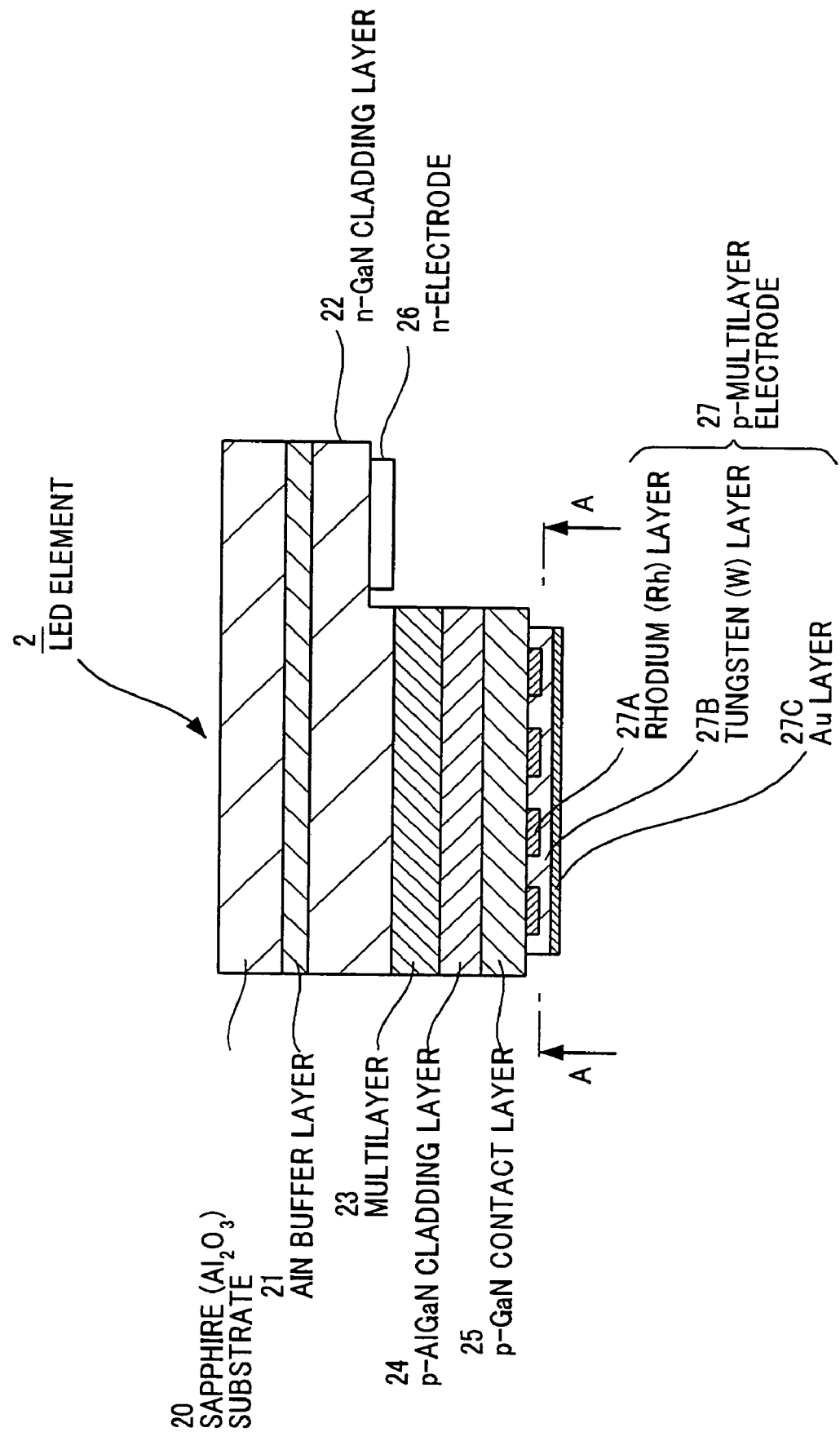

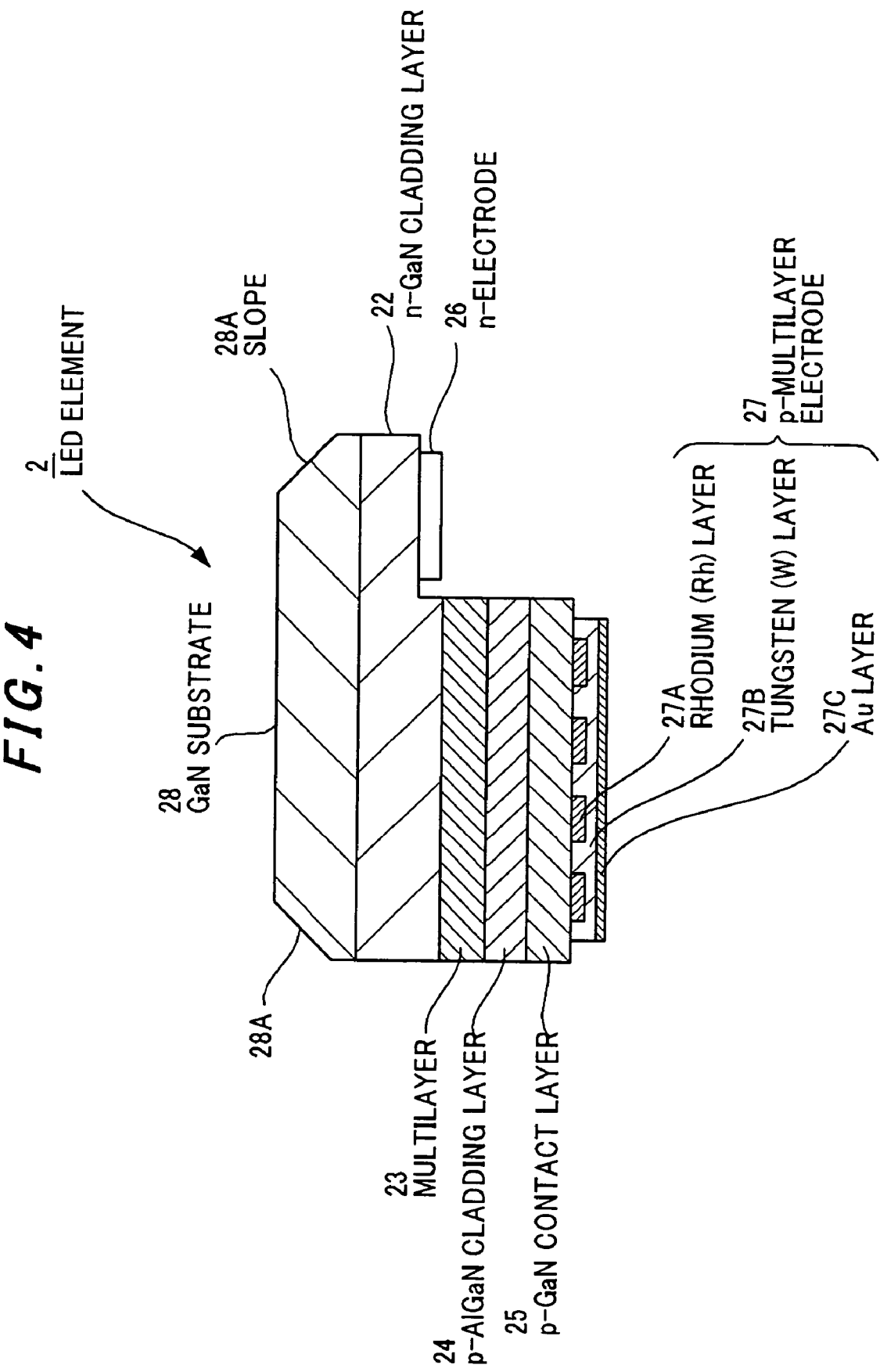

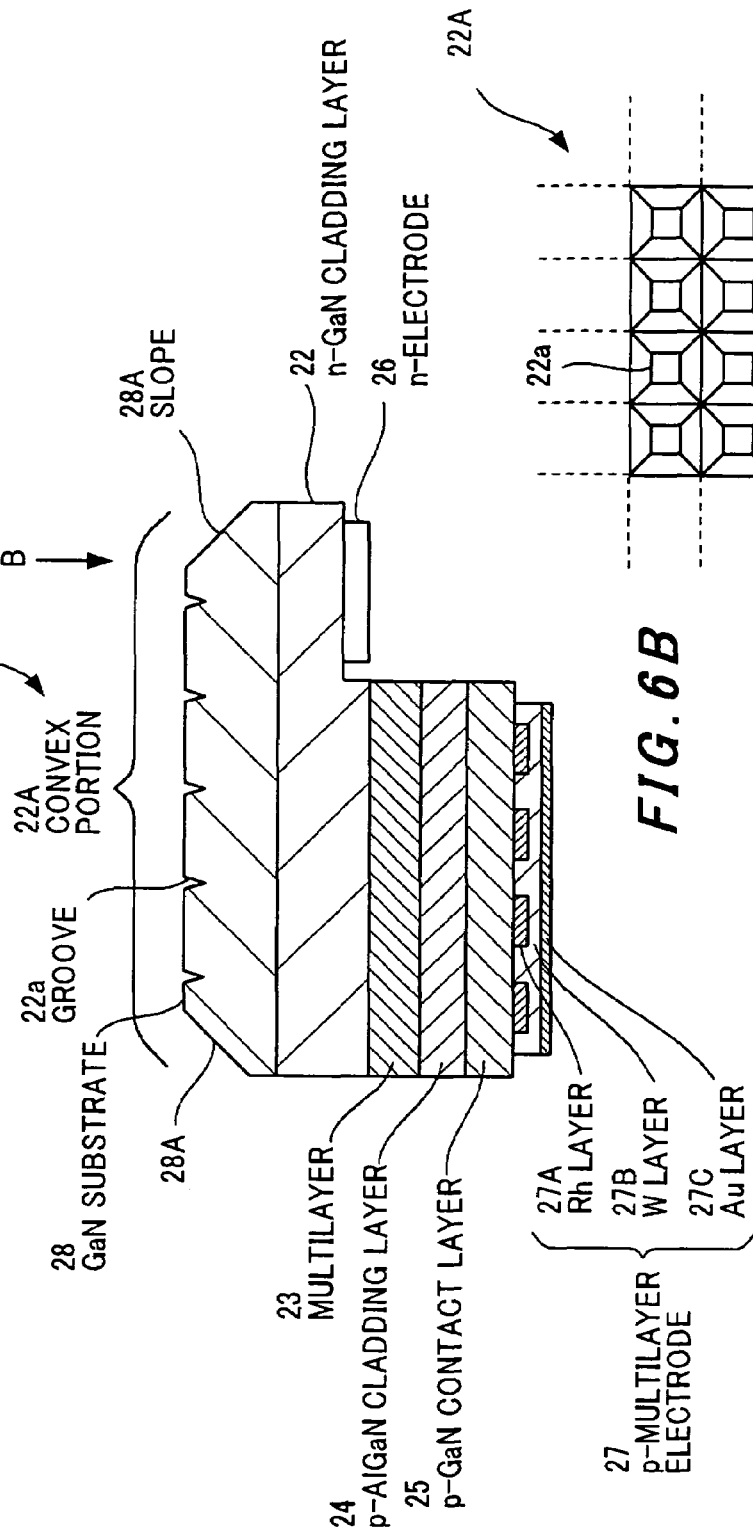
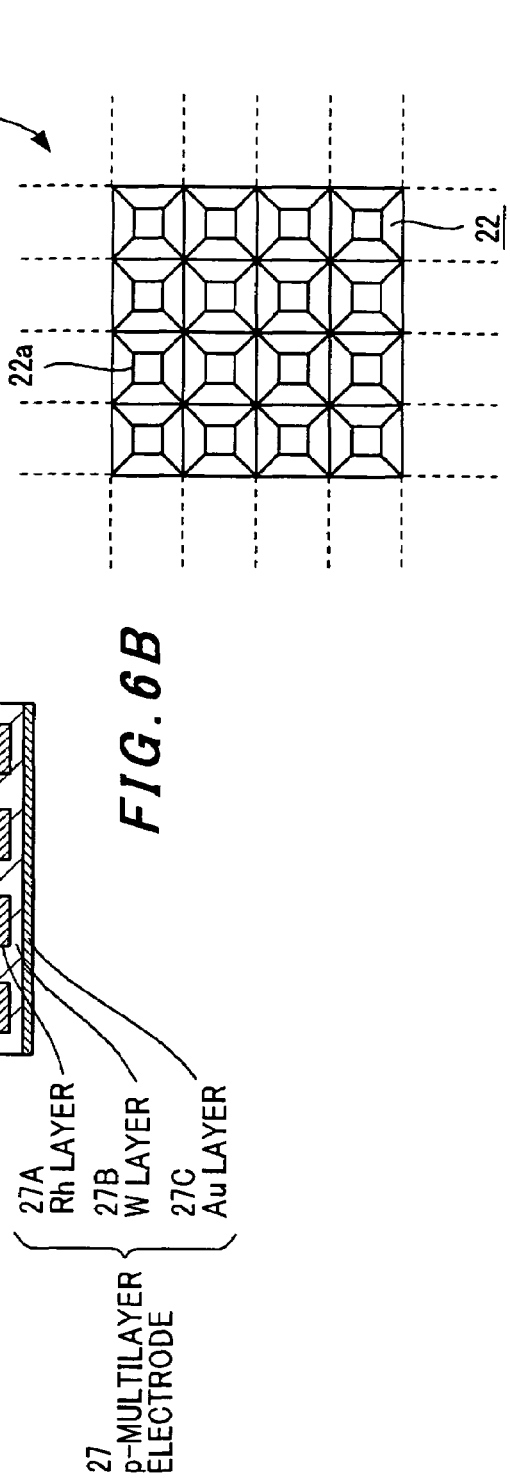
FIG. 6A
FIG. 6B

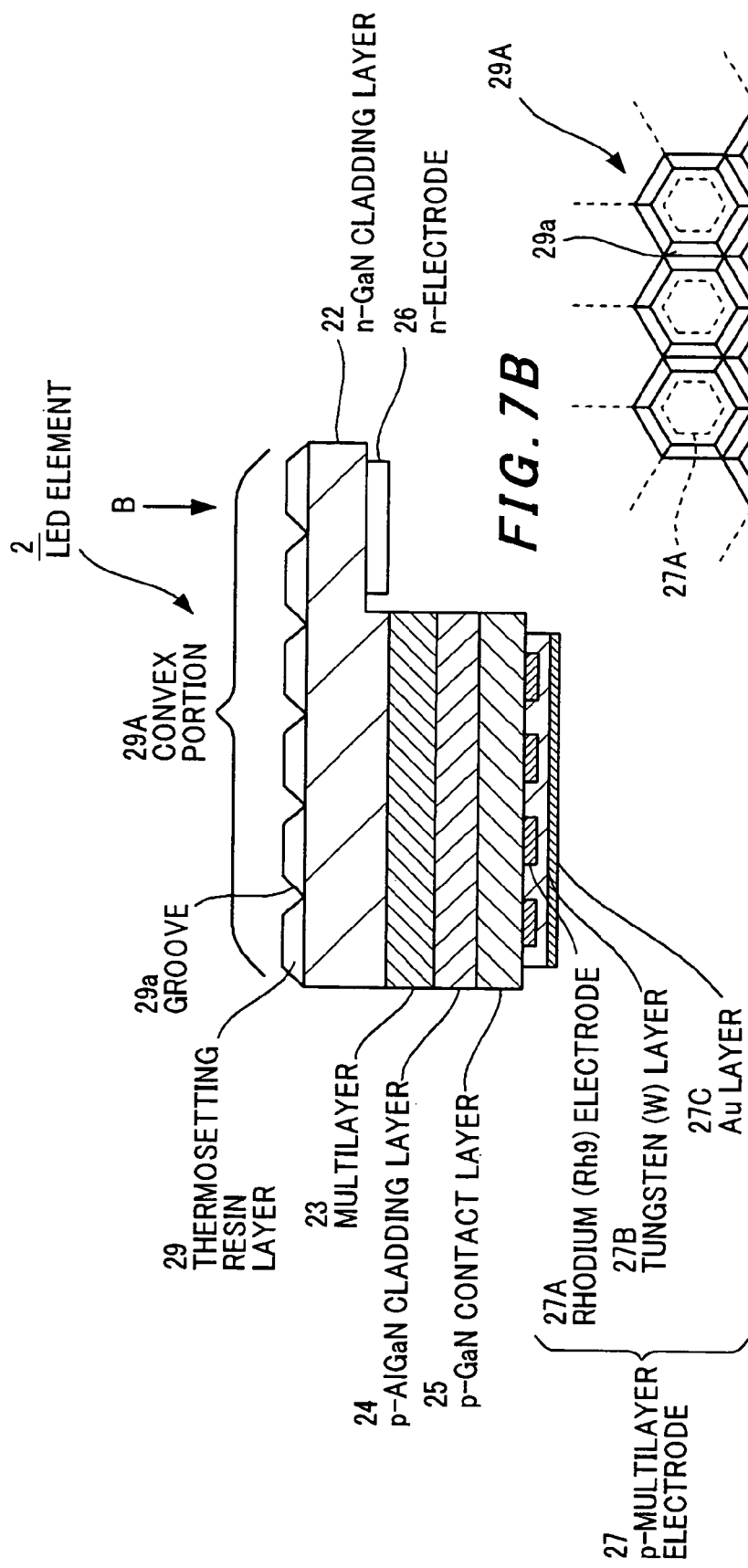
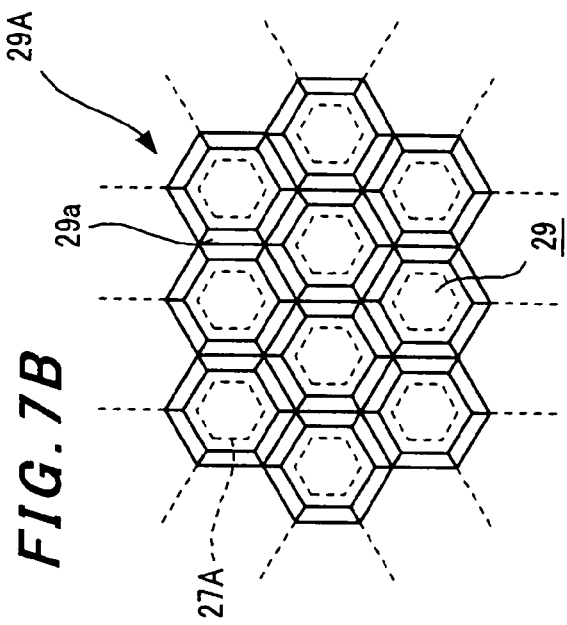
FIG. 7A
FIG. 7B

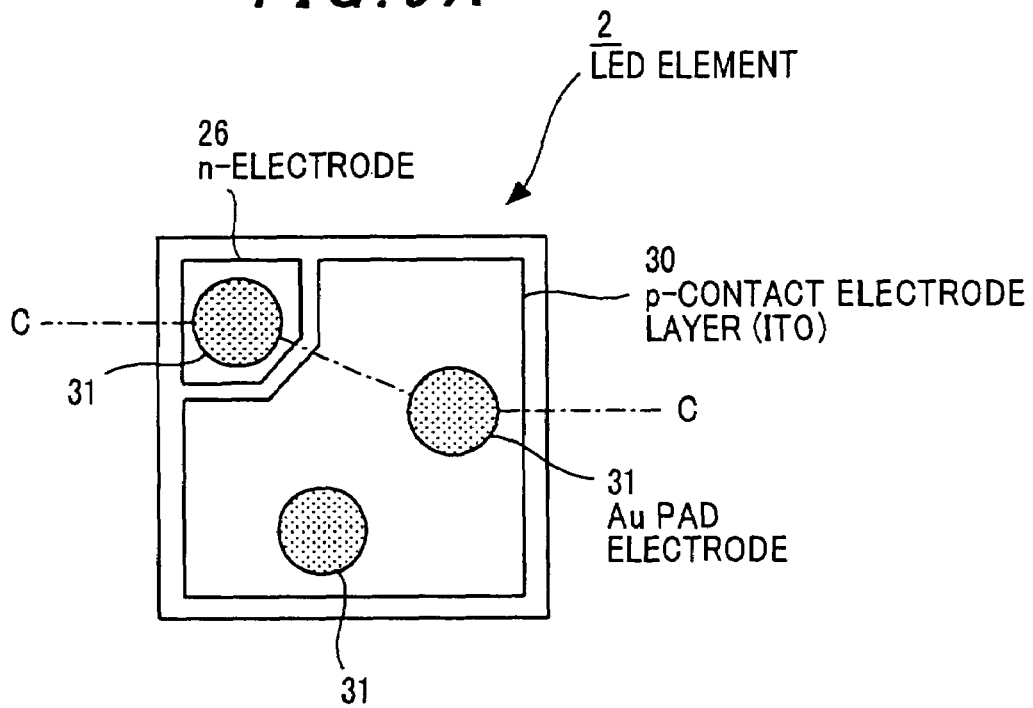
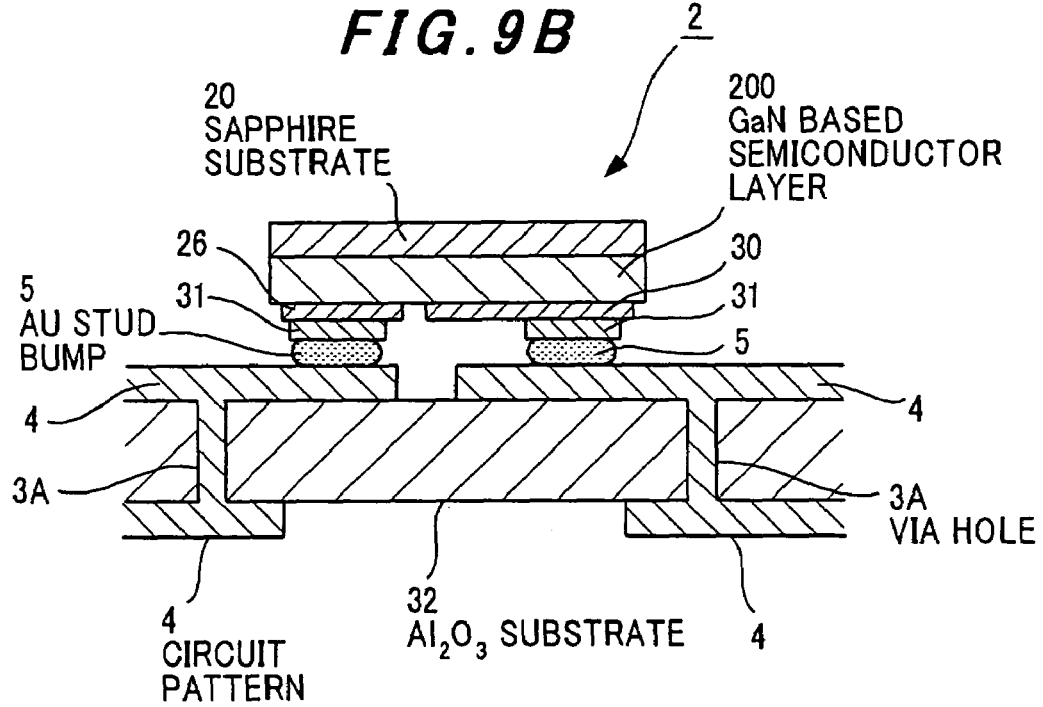

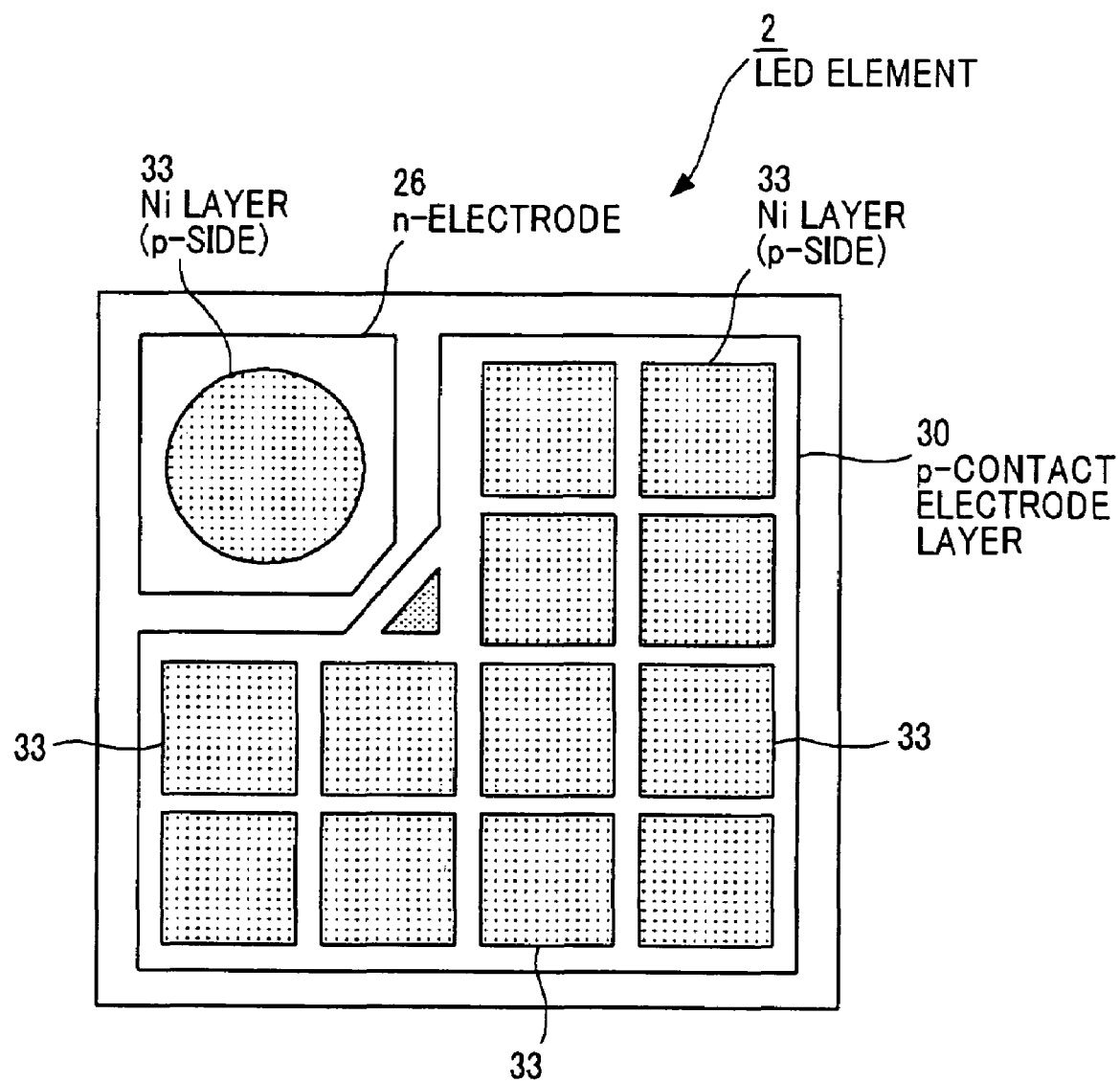

SOLID-STATE ELEMENT AND SOLID-STATE ELEMENT DEVICE

The present application is based on Japanese patent application Nos. 2004-084282, 2004-223600 and 2005-044649, the entire contents of which are incorporated herein by reference.

BACKGROUND OF THE INVENTION

1. Field of the Invention

This invention relates to a solid-state element and a slid-state device and, particularly, to a solid-state element and a slid-state device that prevent the separation of electrode and the reduction of bonding strength cause by a thermal stress so as to discharge efficiently light from inside of the device.

2. Description of the Related Art

One of conventional solid-state devices is a light emitting device that an LED (light-emitting diode) element as a solid-state element is mounted on a substrate with a lead frame or a wiring pattern. In the light emitting device using the LED element, it is important that light confined inside the LED element is reduced to enhance the external radiation efficiency in order to have a high-brightness or high-output device.

One of the LED elements is a flip-chip type LED element that a semiconductor layer is formed on a transparent substrate such as sapphire and light is discharged from the side of the transparent substrate. The flip-chip type LED element is excellent in the external radiation efficiency since it does not generate an optical loss in the semiconductor layer or a passivation film. In the device mounting, the flip-chip type LED element is flip-chip bonded to a wiring member such as a lead frame inside a reflow furnace at a temperature of 250 to 300° C.

In recent years, as a solder used for the electrical connection of LED element, a lead (Pb) free solder is researched according to considerations to the environment. The Pb free solder has a melting point higher than a Pb containing solder, and therefore a problem is caused that the emission efficiency lowers due to an increase in thermal stress in the flip-chip bonding of LED element.

Japanese patent application laid-open No. 11-150297 (related art 1) discloses a nitride semiconductor light emitting element that its p-electrode is multilayered to improve the emission efficiency of such a flip-chip type LED element.

The nitride semiconductor light emitting element is composed of a first positive electrode that is in ohmic-contact with a p-GaN based semiconductor layer, and a second positive electrode formed on the first positive electrode. The second positive electrode includes a layer of Au or Pt, which is in contact with the first positive electrode, in order to enable a light-emitting layer located directly under the second positive electrode to emit light ([0012] and FIG. 1 of the related art 1).

However, in the above related art 1, there is a problem that the electrode layer may be separated (peeled) from the semi-conductor layer due to a difference in thermal expansion coefficient therebetween under high-temperature conditions such as reflowing, since the first and second positive electrodes are formed in continuous planar face.

SUMMARY OF THE INVENTION

It is an object of the invention to provide a solid-state element and a solid-state element device using the solid-state element that can prevent the separation of its electrode layer caused by a difference in thermal expansion coefficient.

(1) According to the invention, a solid-state element comprises:

a semiconductor layer formed on a substrate, the semiconductor layer comprising a first layer that corresponds to an emission area of the solid-state element to and a second layer through which current is supplied to the first layer;

a light discharge surface through which light emitted from the first layer is externally discharged, the light discharge surface being located on the side of the substrate; and an electrode comprising a plurality of regions that are of a conductive material and are in ohmic-contact with the second layer.

It is preferred that the plurality of regions are spread on the surface of the semiconductor layer, and the surface of the semiconductor layer is covered with the other conductive material with a thermal expansion coefficient that is closer to the semiconductor layer than the electrode.

The plurality of regions may be connected to each other.

It is preferred that the conductive material does not diffuse into the semiconductor to make an intermetallic compound.

It is preferred that the semiconductor layer comprises a GaN based semiconductor compound.

It is preferred that the light discharge surface comprises an uneven surface formed by processing the substrate.

It is preferred that the light discharge surface comprises a convex portion, the conductive material is disposed according to the convex portion.

It is preferred that the convex portion comprises a high-refractive resin layer formed on the semiconductor layer.

It is preferred that the substrate comprises a material with a refractive index substantially equal to the semiconductor layer.

(2) According to another aspect of the invention, a solid-state element comprises:

a semiconductor layer formed on a substrate, the semiconductor layer comprising a first layer that corresponds to an emission area of the solid-state element to and a second layer through which current is supplied to the first layer;

a light discharge surface through which light emitted from the first layer is externally discharged, the light discharge surface being located on the side of the substrate;

a contact electrode layer with a thermal expansion coefficient substantially equal to the solid-state element; and a joint portion that is formed partially on the contact electrode layer and is connected to an external wiring portion.

It is preferred that the joint portion comprises nickel (Ni) formed a thick film.

It is preferred that the semiconductor layer comprises a light-emitting layer to emit light based on current supplied thereto.

(3) According to another aspect of the invention, a solid-state element device comprises:

a solid-state element;

a mount substrate on which the solid-state element is mounted, the mount substrate having a thermal expansion coefficient substantially equal to the solid-state element; and an inorganic seal portion that seals the solid-state element, wherein the solid-state element comprises a contact electrode layer with a thermal expansion coefficient substantially equal to the solid-state element, and a joint portion that is formed partially on the contact electrode layer and is connected to an external wiring portion.

(4) According to another aspect of the invention, a solid-state element device comprises:

a solid-state element comprising: a semiconductor layer formed on a substrate, the semiconductor layer comprising a first layer that corresponds to an emission area of the solid-state element to and a second layer through which current is supplied to the first layer; and a light discharge surface through which light emitted from the first layer is externally discharged, the light discharge surface being located on the side of the substrate;

a contact electrode layer with a thermal expansion coefficient substantially equal to the solid-state element;

a joint portion that is formed partially on the contact electrode layer and is connected to an external wiring portion.

a mount substrate on which the solid-state element is mounted, the mount substrate having a thermal expansion coefficient substantially equal to the solid-state element; and an inorganic seal portion that seals the solid-state element.

It is preferred that the joint portion is formed partially on the contact electrode layer.

It is preferred that the inorganic seal portion comprises a glass material with a thermal expansion coefficient substantially equal to the substrate.

It is preferred that the contact electrode layer comprises a conductive metal oxide such as ITO.

(5) According to another aspect of the invention, a solid-state element device comprises:

a solid-state element;

a mount substrate on which the solid-state element is mounted, the mount substrate being of an inorganic material with a thermal expansion coefficient substantially equal to the solid-state element; and an inorganic seal portion that seals the solid-state element, wherein the solid-state element comprises a contact electrode layer that comprises a conductive metal oxide, and a joint portion that is formed on the contact electrode layer and is connected to a wiring portion formed on the mount substrate.

It is preferred that the conductive metal oxide comprises ITO.

BRIEF DESCRIPTION OF THE DRAWINGS

The preferred embodiments according to the invention will be explained below referring to the drawings, wherein:

FIG. 1 is a cross sectional view showing a light emitting device as a solid-state element device in a first preferred embodiment according to the invention;

FIG. 2 is a cross sectional view showing an LED element in FIG. 1;

FIG. 4 is a cross sectional view showing an LED element in a second preferred embodiment according to the invention;

FIG. 6A is a cross sectional view showing an LED element in a third preferred embodiment according to the invention;

FIG. 6B is a top view showing the LED element in FIG. 6A viewed from a position B in FIG. 6A;

FIG. 7A is a cross sectional view showing an LED element in a fourth preferred embodiment according to the invention;

FIG. 7B is a top view showing the LED element in FIG. 7A viewed from a position B in FIG. 7A;

FIG. 9A is a bottom view showing an LED element (viewed from its electrode forming surface) in a sixth preferred embodiment according to the invention;

FIG. 9B is a cross sectional view cut along a line C-C in FIG. 9A;

FIG. 15 is a plain view showing an LED element (viewed from its electrode forming surface) in a twelfth preferred embodiment according to the invention.

DETAILED DESCRIPTION OF THE PREFERRED EMBODIMENTS

Figure 3A:
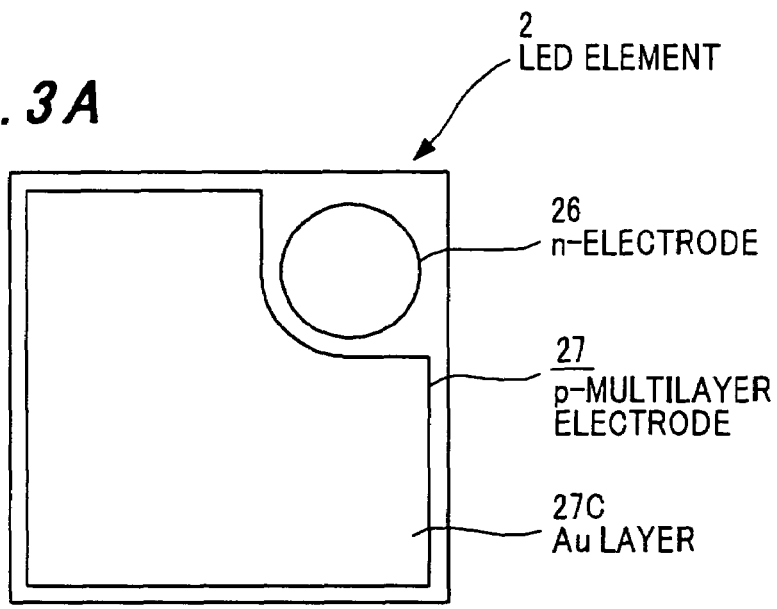
FIG. 3A is a bottom view showing the LED element in FIG. 2 viewed from an electrode forming surface of the LED element.

First Embodiment (Composition of Light Emitting Device 1)

FIG. 1 is a cross sectional view showing a light emitting device as a solid-state element device in the first preferred embodiment according to the invention.

The light emitting device 1 is composed of: a flip-chip type LED element 2 as a solid-state element that is of GaN based semiconductor; an $Al_2O_3$ substrate 3 on which the LED element 2 is mounted; a circuit pattern 4 that is composed of tungsten (W)/nickel (Ni)/gold (Au) and is formed on the $Al_2O_3$ substrate 3; an Au stud bump 5 that is formed as a joint portion to connect between the LED element 2 and the circuit pattern 4; and a glass seal material 6 that seals the LED element 2 and is bonded to the $Al_2O_3$ substrate 3.

The $Al_2O_3$ substrate 3 is provided with a via hole 3A to electrically connect between the circuit patterns 4 that are of W—Ni and metallized at the front surface and back surface of the substrate 3.

The glass seal material 6 is of low-melting glass and is formed rectangular with a top face 6A and a side face 6B by cutting by a dicer after hot-pressed using a mold to be bonded to the $Al_2O_3$ substrate 3.

(Composition of the LED Element 2)

FIG. 2 is a cross sectional view showing an LED element in FIG. 1.

The LED element 2 is composed of: a sapphire ($Al_2O_3$) substrate 20; and sequentially grown on the sapphire substrate 20, an AlN buffer layer 21, an n-GaN cladding layer 22, a multilayer 23 including a light-emitting layer, a p-AlGaN cladding layer 24, and a p-GaN contact layer 25. Further, it is provided with a n-electrode 26 that is formed on part of the n-GaN cladding layer 22 exposed by removing the p-GaN contact layer 25 through the n-GaN cladding layer 22 by etching, and a p-multiplayer electrode 27 that is formed on the surface of the p-GaN contact layer 25.

(Composition of the p-multiplayer Electrode 27)

The p-multiplayer electrode 27 is composed of: a rhodium (Rh) layer 27A that is formed a lattice on the surface of the p-GaN contact layer 25; a tungsten (W) layer 27B that is formed on the surface of the p-GaN contact layer 25 and the rhodium (Rh) layer 27A; and an Au layer 27C that is formed on the surface of the tungsten (W) layer 27B.

(Fabrication of the LED Element 2)

In fabricating the LED element 2, the sapphire substrate 20 as a wafer is first provided. Then, formed on the sapphire substrate 20 by a known method are the AlN buffer layer 21, the n-GaN cladding layer 22, the multilayer 23 including a light-emitting layer, the p-AlGaN cladding layer 24, the p-GaN contact layer 25, and the n-electrode 26.

Then, the rhodium (Rh) layer 27A is formed on the surface of the p-GaN contact layer 25 by deposition. Then, a photoresist is formed on the surface of the rhodium (Rh) layer 27A. Then, a resist mask in a lattice form is disposed on the photoresist is exposed. Then, exposed part of the rhodium (Rh) layer 27A is removed by etching. Then, the resist mask is removed from the surface of the lattice-patterned rhodium (Rh) layer 27A. Then, the tungsten (W) layer 27B is formed thereon by deposition to cover the lattice-patterned rhodium (Rh) layer 27A. Then, the Au layer 27C is formed on the tungsten (W) layer 27B by deposition. Then, the sapphire substrate 20 with the GaN based semiconductor layers is diced into 0.3 mm×0.3 mm. Thus, the LED element 2 is obtained.

(p-multiplayer Electrode 27)

Figure 3B:
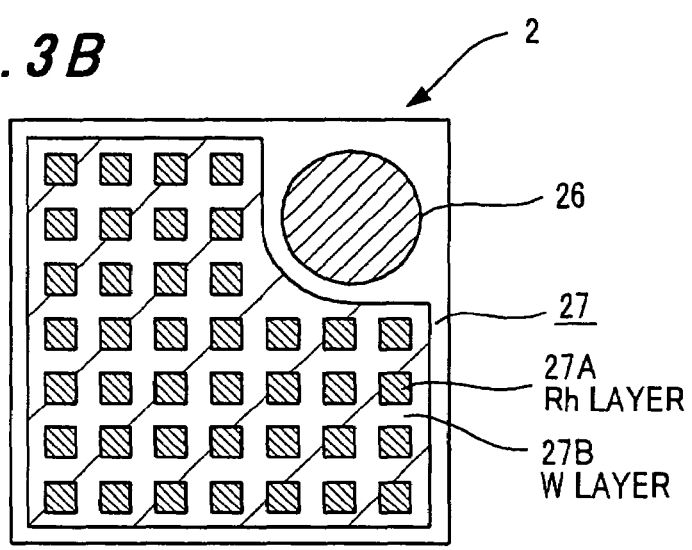
FIG. 3B is a cross sectional view cut along a line A-A in FIG. 2.
Figure 3C:
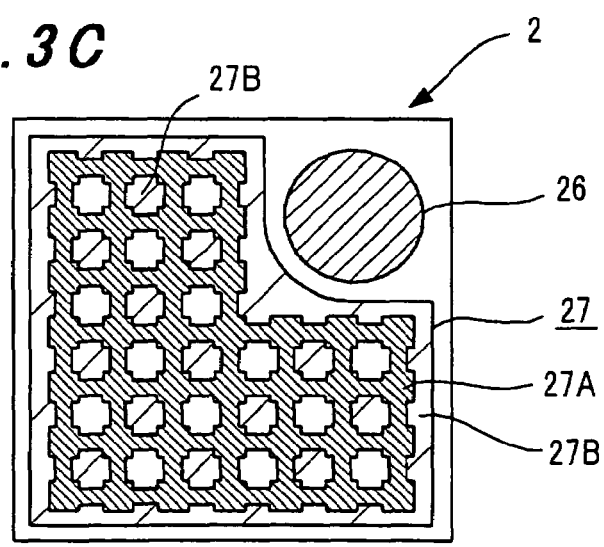
FIG. 3C is a bottom view showing a modification of a p-multiplayer electrode 27 in FIG. 3B.

FIG. 3A is a bottom view showing the LED element in FIG. 2 viewed from the electrode forming surface of the LED element. FIG. 3B is a cross sectional view cut along the line A-A in FIG. 2. FIG. 3C is a bottom view showing a modification of the p-multiplayer electrode 27 in FIG. 3B.

The p-multiplayer electrode 27 is, as shown in FIG. 3A, covered with the Au layer 27C formed on the surface. The lattice-patterned rhodium (Rh) layer 27A surrounded by the tungsten (W) layer 27B is formed under the Au layer 27C as shown in FIG. 3B. The lattice-patterned rhodium (Rh) layer 27A is composed of a plurality of regions formed in rectangular dots. The regions emit light when current is supplied through the Au layer 27C.

The lattice-patterned rhodium (Rh) layer 27A may be formed such that the regions are connected with each other as shown in FIG. 3C. The connection form may be such that part of the regions is connected regularly or irregularly.

(Fabrication of the Light Emitting Device 1)

First, the $Al_2O_3$ substrate 3 with the via hole 3A is provided. A tungsten (W) paste is screen-printed on the surface of the $Al_2O_3$ substrate 3 according to the circuit pattern 4. Then, the $Al_2O_3$ substrate 3 with the tungsten paste printed thereon is heat-treated at 1000° C. or higher so as to bond the tungsten onto the substrate 3. Then, Ni plating and Au plating are formed on the tungsten to make the circuit pattern 4. Then, the LED element 2 is electrically connected through the Au stud bump 5 to the circuit pattern 4 on the front surface of the $Al_2O_3$ substrate 3. Then, a low-melting glass plate is placed parallel to the $Al_2O_3$ substrate 3 with the LED element 2 mounted thereon, and the hot pressing is conducted at a pressure of 60 kgf and a temperature of 600° C. in a nitrogen atmosphere. The low-melting glass is bonded to the $Al_2O_3$ substrate 3 through oxides contained therein. Then, the $Al_2O_3$ substrate 3 integrated with the low-melting glass is diced by a dicer, and thereby the rectangular light emitting device 1 is separated.

(Operation of the Light Emitting Device 1)

When a voltage is applied by connecting the circuit pattern 4 to a power source (not shown), the LED element 2 emits blue light with a wavelength of 460 nm while having light emitted in planar form inside the multilayer 23. The blue light enters into the sapphire substrate 20 from the multilayer 23 through the n-GaN cladding layer 22 and the AlN buffer layer 21, entering into the glass seal material 6 from the sapphire substrate 20, externally discharged from the top face 6A and the side face 6B.

Effects of the First Embodiment

In the first embodiment explained above, the lattice-patterned rhodium (Rh) layer 27A is formed on the surface of the p-GaN contact layer 25. Thereby, the p-GaN contact layer 25 can be ohmic-contacted with the p-multiplayer electrode 27 and a good bonding property can be obtained therebetween.

Further, the rhodium (Rh) layer 27A is lattice-patterned and the tungsten with a thermal expansion coefficient of about $5 \times 10^{-6}/°$ C., which is equal to that of GaN based layers (the p-AlGaN cladding layer 24, the p-GaN contact layer 25) of the LED element 2 as compared to a thermal expansion coefficient of $8 \times 10^{-6}/°$ C. of rhodium, is formed. Thereby, a thermal stress caused by a difference in thermal expansion coefficient from the Au layer ($15 \times 10^{-6}/°$ C.) with the biggest thermal expansion coefficient in the components can be reduced. Therefore, the separation (peeling) of the electrode layer can be prevented even under high-temperature conditions such as glass sealing and reflowing. Thus, the stable flow of current into the multilayer 23 can be performed.

Further, by mounting the LED element 2 on the $Al_2O_3$ substrate 3 with a thermal expansion coefficient equal to the LED element 2, a thermal stress caused by a difference in thermal expansion coefficient between the LED element 2 and the $Al_2O_3$ substrate 3 can be reduced. In this embodiment, since the LED element 2 is constructed such that the GaN based layers are formed on the sapphire substrate 20 (with a thermal expansion coefficient of $7 \times 10^{-6}/°$ C.), the entire thermal expansion coefficient of the LED element 2 can be deemed equal to the sapphire substrate 20. By thus reducing the stress, the separation therebetween can be prevented even under high-temperature conditions such as glass sealing.

Although in the first embodiment the rhodium (Rh) layer 27A is lattice-patterned, it may be also formed a mesh or a dotted pattern other than the modification as shown in FIG. 3C. The other electrode material for ohmic contact may be chromium (Cr) with a large bonding strength. The patterning structure is especially effective in the ohmic electrode for the GaN based semiconductor layers since they cannot have a sufficient bonding strength as GaAs or AlInGaP based semiconductors, where its electrode element diffuses into the semiconductor layer and an intermetallic compound is formed therebetween. The patterning structure is also effective for the other semiconductor where the electrode material is unlikely to diffuse into the semiconductor layer. The same effect can be obtained even when the electrode material is likely to diffuse into the semiconductor layer.

It is preferred that the electrode material such as rhodium is deposited by sputtering rather than electron beam deposition, which is sufficient, so as to enhance the bonding strength to the surface of GaN based semiconductors.

Modification of the First Embodiment

A modification of the light emitting device 1 may be a wavelength conversion type light emitting device that a phosphor-containing epoxy resin is used as a seal material in place of the glass seal material 6. The phosphor can be, for example, Ce:YAG (yttrium aluminum garnet). In this case, the phosphor is excited by light of 460 nm to radiate a yellow excited light of 520 to 550 nm. The yellow excited light is mixed with the blue light to generate a white light.

Second Embodiment (Composition of LED Element 2)

FIG. 4 is a cross sectional view showing an LED element in the second preferred embodiment according to the invention.

The LED element 2 of the second embodiment is different from the first embodiment in that a GaN substrate 28 (with a refractive index of n=2.4) is used in place of the sapphire substrate 20 and a Bi based high-refractive index glass with a refractive index of 1.85 is used. The GaN substrate 28 is provided with a slope 28A formed by removing the corner portion by cutting or polishing etc. In this embodiment, like parts are indicated by the same numerals as used in the first embodiment.

Effects of the Second Embodiment

In the second embodiment, adding to the effects of the first embodiment, due to using the GaN substrate 28, the light generated in the multilayer 23 can reach the interface between the GaN substrate 28 and the glass seal material (not shown in FIG. 4) without having an optical loss. Further, since the seal material has a high refractive index and the LED element 2 is not rectangular but formed with the slope 28A, light confined in the LED element 2 can be reduced. Thereby, the external radiation efficiency of the LED element 2 can be enhanced significantly. Also, due to the slope 28A formed on the GaN substrate 28, blue light emitted from the multilayer 23 in the direction of the p-multiplayer electrode 27 and reflected on the p-multiplayer electrode 27 can be discharged externally. Thus, the external radiation efficiency can be enhanced.

Further, since the seal material of the LED element 2 is made of glass, the seal material does not deteriorate due to light or heat generated from the LED element 2 and a high-refractive index characteristic can be obtained. In case of the hard seal material of glass, a crack due to the thermal stress is likely to occur as compared to resins. However, even when a heat contraction of glass in cooling after the device sealing causes a big internal stress, the slope 28A can prevent the localization of stress in the glass. Thus, the light emitting device 1 can prevent the package crack to offer a good reliability.

(Modification)

Figures 5A, 5B:
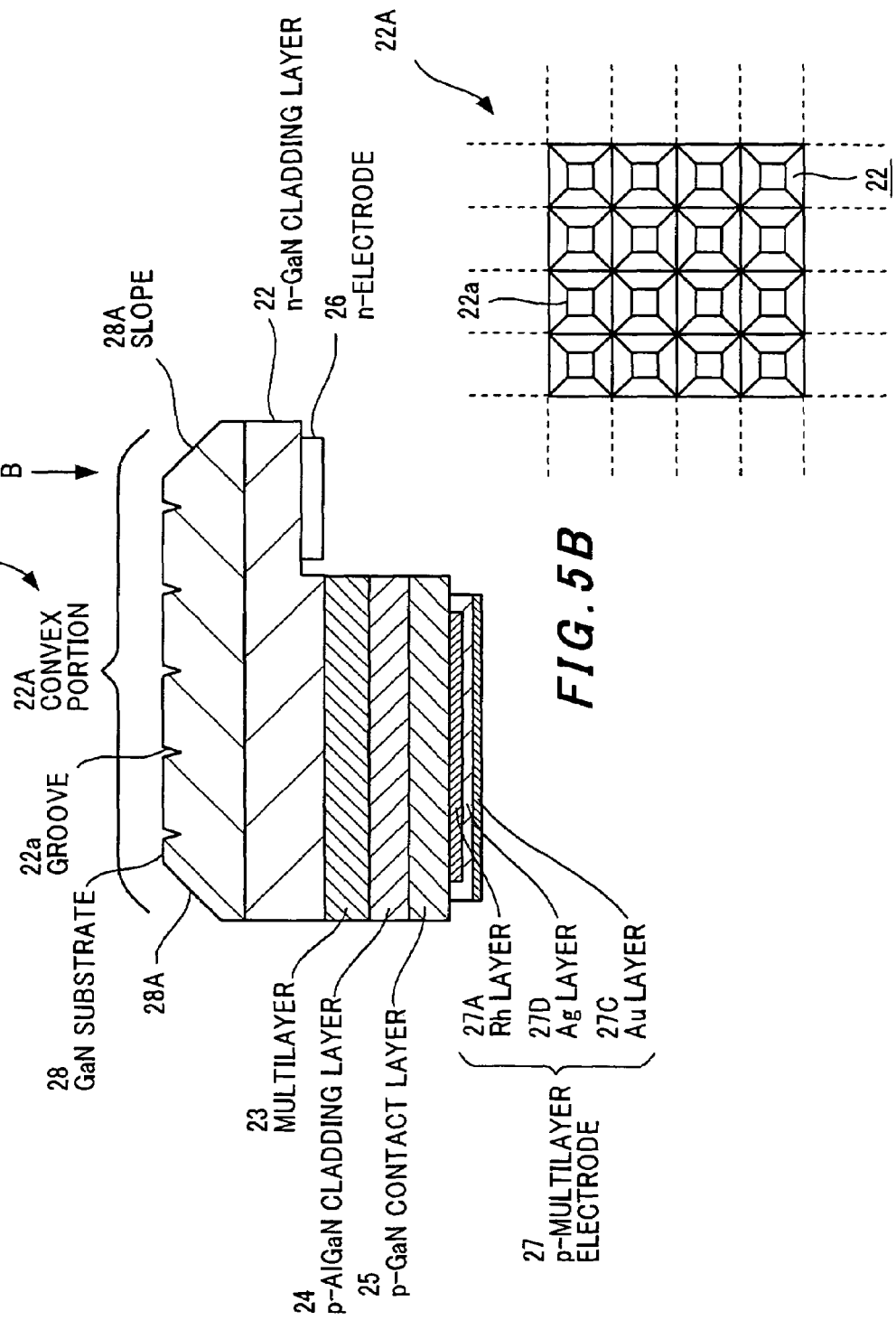
FIG. 5A is a cross sectional view showing a modification (light discharge structure) of the LED element in FIG. 4.
FIG. 5B is a top view showing the LED element in FIG. 5A viewed from a position B in FIG. 5A.

FIG. 5A is a cross sectional view showing a modification (light discharge structure) of the LED element in FIG. 4. FIG. 5B is a top view showing the LED element in FIG. 5A viewed from a position B in FIG. 5A.

The LED element 2 is provided with a convex portion 22A that a groove 22a is formed on the surface of the GaN substrate 28 by cutting. Also, the GaN substrate 28 is provided with a slope 28B formed by cutting the corner portion by cutting or polishing etc. Further, a continuous Ag layer 27D is formed in the p-multiplayer electrode 27 instead of the tungsten layer 27B.

In the LED element 2 thus formed, since the GaN substrate 28 has the uneven light discharge surface, the area of the light discharge surface increases. Thereby, the light discharge characteristic of the LED element 2 can be enhanced. Also, blue light emitted form the multilayer 23 in the direction of the p-multiplayer electrode 27 and reflected on the p-multiplayer electrode 27 can be well discharged externally. Thus, the external radiation efficiency can be enhanced.

Third Embodiment (Composition of LED Element 2)

FIG. 6A is a cross sectional view showing an LED element in the third preferred embodiment according to the invention. FIG. 6B is a top view showing the LED element in FIG. 6A viewed from a position B in FIG. 6A.

The LED element 2 is composed of the GaN substrate 28 with the groove 22a formed by cutting on the light discharge surface as explained in FIG. 5A, and the p-multiplayer electrode 27 with the tungsten (W) layer 27B lattice-patterned.

Effects of the Third Embodiment

In the third embodiment, due to the lattice-patterned tungsten (w) layer 27B, the separation of the electrode layer can be prevented. In addition, the p-GaN has a high resistivity, which allows the formation of an emission area according to the pattern of ohmic electrodes, and the uneven surface is formed according to the emission area. Therefore, the light discharge characteristic from the GaN based semiconductor layer can be enhanced.

Fourth Embodiment (Composition of LED Element 2)

FIG. 7A is a cross sectional view showing an LED element in the fourth preferred embodiment according to the invention. FIG. 7B is a top view showing the LED element in FIG. 7A viewed from a position B in FIG. 7A.

The LED element 2 of the fourth embodiment is different from the first embodiment in that the sapphire substrate 20 is separated from the LED element 2 of the first embodiment by using a laser light and, instead, a thermosetting resin layer 29 with a refractive index of n=2.1 is formed 100 μm thick on the surface of the n-GaN cladding layer 22.

The thermosetting resin layer 29 is provided with a convex portion 29A that hexagonal convex faces are zigzag-patterned. Further, the rhodium (Rh) layer 27A is formed into hexagonal portions (or islands) zigzag-patterned on the p-GaN contact layer 25. As shown in FIG. 7B, the convex portion 29A (hexagonal convex faces) of the thermosetting resin layer 29 is arranged according to the rhodium (Rh) layer 27A (hexagonal islands).

The thermosetting resin layer 29 is formed such that a sheet of thermosetting resin is previously patterned by molding such as press molding according to the hexagonal convex faces of the convex portion 29A, and the patterned sheet is bonded onto the surface of the n-GaN cladding layer 22.

Alternatively, instead of using the sheet of thermosetting resin, the thermosetting resin layer 29 may be formed on the surface of the n-GaN cladding layer 22 by injecting the thermosetting resin into a mold. In this case, the mold is provided with the pattern according to the hexagonal convex faces of the convex portion 29A.

The LED element 2 with the thermosetting resin layer 29 thus formed is sealed with silicone resin.

Effects of the Fourth Embodiment

In the fourth embodiment, the thermosetting resin layer 29 with a refractive index near to the GaN based semiconductor layer is used and the thermosetting resin layer 29 is provided with the convex portion 29A. Thereby, the light discharge surface with the high refractive index and the enlarged surface area can be easily formed without requiring any process such as cutting and polishing on the surface of the n-GaN cladding layer 22.

Also, since the convex portion 29A (hexagonal convex faces) of the thermosetting resin layer 29 is arranged according to the rhodium (Rh) layer 27A (hexagonal islands), blue light emitted from the multiplayer 23 directly over the rhodium (Rh) layer 27A can reach the light discharge surface with the enlarged area. Thereby, externally dischargeable light increases as compared to the case that the light is discharged from a planar light discharge surface.

The convex portion 29A may be formed as shown in FIG. 5B, and the convex face may be curved. The convex faces may be arranged in another pattern other than the zigzag pattern.

The thermosetting resin layer 29 may be provided with a roughened surface that allows the surface area larger than a planar surface, instead of using the convex portion 29A.

Fifth Embodiment (Composition of LED Element 2)

Figure 8:
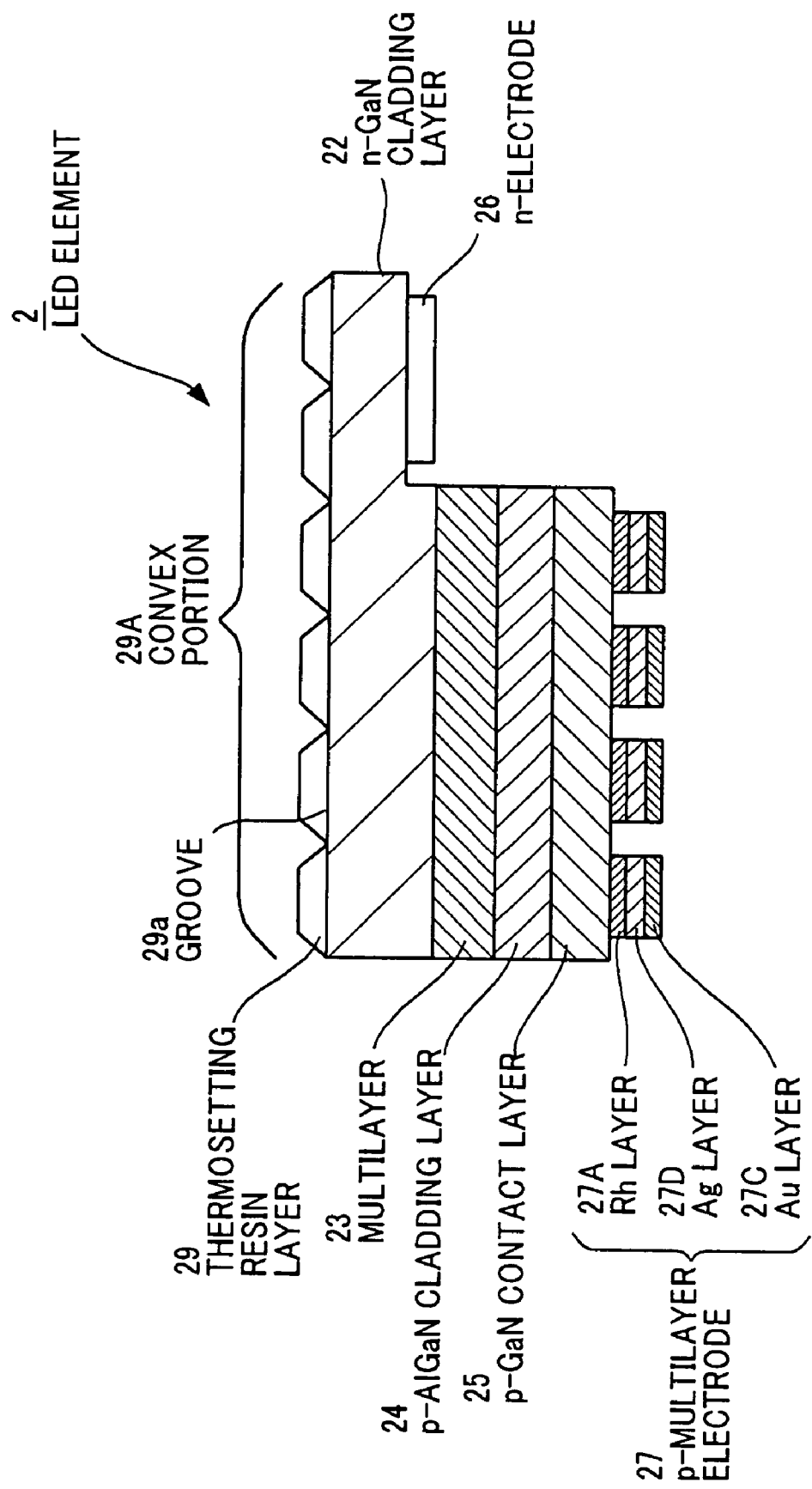
FIG. 8 is a cross sectional view showing an LED element in a fifth preferred embodiment according to the invention.

FIG. 8 is a cross sectional view showing an LED element in the fifth preferred embodiment according to the invention.

The LED element 2 of the fifth embodiment is different from the fourth embodiment in that the p-multiplayer electrode 27 is constructed such that the Ag layer 27D and the Au layer 27C are, as separate electrode regions, formed in a lattice pattern as well as the rhodium (Rh) layer 27A.

The rhodium (Rh) layer 27A has such a small thickness that allows the transmission of light emitted from the multiplayer 23 such that the transmitted light is reflected on the Ag layer 27D with a good reflection efficiency.

Effects of the Fifth Embodiment

In the fifth embodiment, adding to the effects of the fourth embodiment, the thermal stress caused by a difference in thermal expansion coefficient between the p-multiplayer electrode 27 and the GaN based semiconductor layer can be reduced. Therefore, the separation (peeling) of the electrode layer can be prevented even under high-temperature conditions such as glass sealing and reflowing. Thus, the stable flow of current into the multilayer 23 can be performed.

Further, by setting the reflectivity at the electrode layer to be between the rhodium (Rh) layer 27A and the Ag layer 27D, the reflectivity can be enhanced. Thereby, the external radiation efficiency can be enhanced.

Sixth Embodiment (Composition of LED Element 2)

FIG. 9A is a bottom view showing an LED element (viewed from its electrode forming surface) in the sixth preferred embodiment according to the invention. FIG. 9B is a cross sectional view cut along the line C-C in FIG. 9A.

The LED element 2 is, as shown in FIG. 9A, provided with an n-electrode 26 made of Ti/Pt, a p-contact electrode layer 30 as a p-contact electrode made of ITO (indium tin oxide) with a thermal expansion coefficient substantially equal to the LED element 2 (of GaN based semiconductor), and Au pad electrodes 31 formed partially on the n-electrode 26 and the p-contact electrode layer 30. The LED element 2 sizes about 300 μm square. The ITO is thinly formed by EB (electron beam) deposition.

FIG. 9B shows in partially enlarged view the case that the LED element 2 of the sixth embodiment is applied to the light emitting device 1 of the first embodiment as shown in FIG. 1. In the sixth embodiment, the circuit pattern 4 is made of W/Ni/Ag on the device mounting side and of W/Ni/Au on the back side of the substrate 32, where both sides of the circuit pattern 4 are connected through the tungsten (W) pattern in the via hole 3A. The Au pad electrode 31 has substantially the same size as the Au stud bump 5.

In the sixth embodiment, the LED element 2 is mounted on the circuit pattern 4 by thermocompression with ultrasonic of the Au stud bump 5, and sealed with a low-melting glass with a thermal expansion coefficient of $7 \times 10^{-6}/°$ C.

Effects of the Sixth Embodiment

In the sixth embodiment, the Au pad electrode 31 is formed partially on the p-contact electrode layer 30 with a thermal expansion coefficient substantially equal to the LED element 2, and the LED element 2 is mounted through the Au stud bump 5 on the circuit pattern 4 of the $Al_2O_3$ substrate 32 with a thermal expansion coefficient substantially equal to the LED element 2 and sealed with glass. Therefore, the p-contact electrode layer 30 is unlikely to be separated from the GaN based semiconductor layer 200, and the thermal stress can be absorbed while allowing the thermal deformation of the Au pad electrode 31 and the Au stud bump 5.

In experiments by the inventors, the LED element 2 is mounted on substrates with different thermal expansion coefficients, i.e., an $Al_2O_3$ substrate and a glass-containing $Al_2O_3$ substrate (with a thermal expansion coefficient of $12 \times 10^{-6}/°$ C.), and sealed with glass. As a result, comparing to the $Al_2O_3$ substrate, it is confirmed that some of the glass-containing $Al_2O_3$ substrates cause an increase (0.3 V in average) in forward voltage caused by the separation of the electrode and a defect in the emission pattern. Thus, since the LED element 2 has a thermal expansion coefficient substantially equal to the $Al_2O_3$ substrate 32, the thermal stress caused by a difference in thermal expansion coefficient therebetween is not generated even at a high temperature, i.e., 500 to 600° C., in the glass sealing. Therefore, the good-quality glass-sealed LED can be obtained and the yield can be enhanced.

In order to have a good forward voltage and emission pattern without having the electrode separation in the LED element 2 with such a size, it is desired that the mount substrate 32 has a thermal expansion coefficient, i.e., $5 \times 10^{-6}$ to $10 \times 10^{-6}/°$ C., substantially equal to the LED element 2 ($7 \times 10^{-6}/°$ C.).

Further, since the Au pad electrode 31 is formed partially formed on the p-multiplayer electrode 27, the thermal stress generated can be reduced. Also, the thermal stress generated in the mounting can be reduced by mounting the LED element 2 on the substrate with a thermal expansion coefficient substantially equal thereto.

Further, the ITO electrode (p-contact electrode layer 30) has a bonding force to GaN greater than rhodium (Rh) and therefore the separation by the stress is unlikely to occur. Thus, the good-quality glass-sealed LED can be stably produced.

In the glass sealing, a glass material with a relatively high viscosity at a high temperature is press-bonded onto the $Al_2O_3$ substrate. Thereby, an electric interconnecting means such as an Au wire may be collapsed causing an electrical disconnection or a short-circuiting. In order to prevent this, the LED element 2 is flip-chip mounted and the ITO electrode 30 of the LED element 2 is formed on the side of the mount substrate 32. Although the ITO electrode 30 is known as a transparent electrode that allows an enhancement in light discharge, it is used in the invention because it has a thermal expansion coefficient (7.7~8.5×10$^{-6}$/° C.) substantially equal to the LED element 2 and a large bonding force to GaN. Therefore, due to the ITO, the separation of the electrode is unlikely to occur even in the glass sealing at a temperature higher than 500° C.

Alternatively, the electrode material may be AZO(ZnO: Al), IZO(In$_2$O$_3$—ZnO, 90-10 wt %) other than the ITO. Further, the other conductive metal oxides can be used that has properties as the contact electrode layer and a thermal expansion coefficient substantially equal to the LED element 2, and has such a bonding force to the semiconductor layer that can prevent the separation of the electrode.

Although in the above embodiments the LED element 2 is formed such that the GaN based layers are grown on the sapphire substrate (with a thermal expansion coefficient of 7×10$^{-6}$/° C.), it may be formed such that the GaN based layers are grown on a SiC or GaN substrate (with a thermal expansion coefficient of 5×10$^{-6}$/° C.) and the ITO is formed thereon as the p-contact electrode layer 30.

Although in the sixth embodiment the ITO is used as the contact electrode layer with a thermal expansion coefficient equal to the device, rhodium (Rh) (with a thermal expansion coefficient of 8×10$^{-6}$/° C.) may be used in place of the ITO. In case of using Rh, the light discharge characteristic can be enhanced since it also serves as a light reflection layer. Alternatively, an Au/Co film can be used on which a passivation film of SiO$_2$ or SiN etc. is formed to protect the periphery.

In experiments by the inventors, it is confirmed that the separation of electrode is not generated when the LED element 2 not mounted on the mounting substrate is subjected to heat treatment at 600° C. in the conventional structure that the Rh layer is formed on the entire surface of the p-GaN contact layer 25 and the Au layer for a bonding pad is formed on the entire surface of the Rh layer. However, when the LED element 2 is mounted on the glass-containing Al$_2$O$_3$ substrate and sealed with glass, due to the thermal stress generated in the mounting, it is difficult to prevent surely the separation of the electrode layer. Therefore, if the bonding force to the p-GaN contact layer 25 is small and the difference of thermal expansion coefficient is large, it is required that the Au layer for a bonding pad is partially formed in a size as needed and the mounting substrate has a thermal expansion coefficient substantially equal to the LED element 2.

The Au pad electrode 31 may be made of Ag other than Au. Thereby, the light absorption by the pad electrode can be reduced.

Seventh Embodiment (Composition of LED Element 2)

Figure 10:
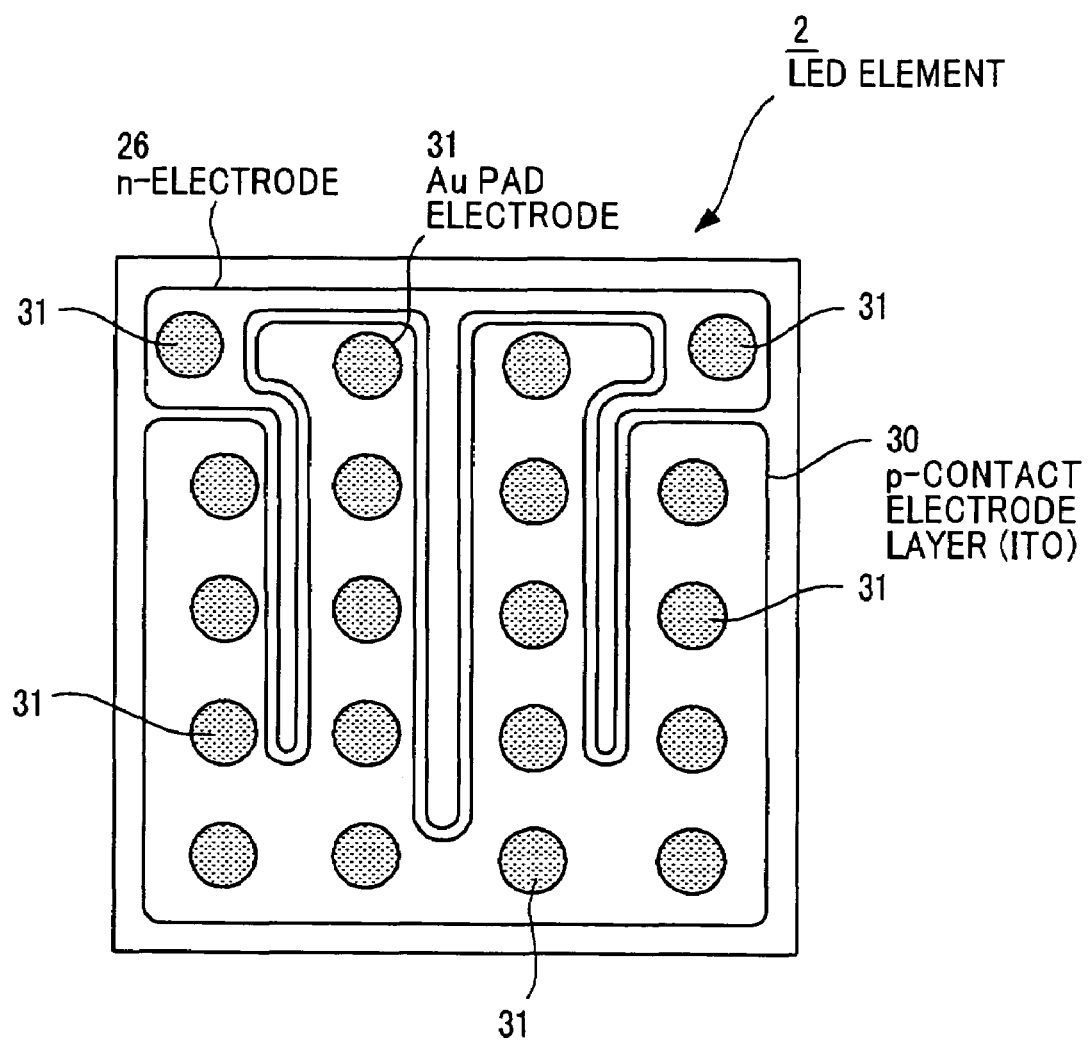
FIG. 10 is a bottom view showing an LED element (viewed from its electrode forming surface) in a seventh preferred embodiment according to the invention.

FIG. 10 is a bottom view showing an LED element (viewed from its electrode forming surface) in the seventh preferred embodiment according to the invention.

The LED element 2, which is a large sized chip of 1000 μm square, is provide with an n-electrode 26 composed of a plurality of Au pad electrodes 31 formed on the n-GaN cladding layer 22, and a p-contact electrode layer 30 that is made of ITO and on which a plurality of Au pad electrodes 31 are formed thereon.

The n-electrode 26 is formed like a comb interposed between stripes of the p-contact electrode layer 30 so as to enhance the current spreading property to the p-GaN layer, and has the two Au pad electrodes 31 formed thereon.

The p-contact electrode layer 30 is formed in a region except the n-electrode 26, and it has the eighteen Au pad electrodes 31 formed thereon at given intervals.

Effects of the Seventh Embodiment

In the seventh embodiment, even in the large sized LED element 2 significantly affected by the thermal stress as compared to a normal size LED element 2, the p-contact electrode layer 30 is unlikely to be separated from the GaN based semiconductor layer 200 like the sixth embodiment. Therefore, an uniform emission can be obtained without generating an unevenness in emission within the emission region.

Eighth Embodiment (Composition of LED Element 2)

Figure 11A:
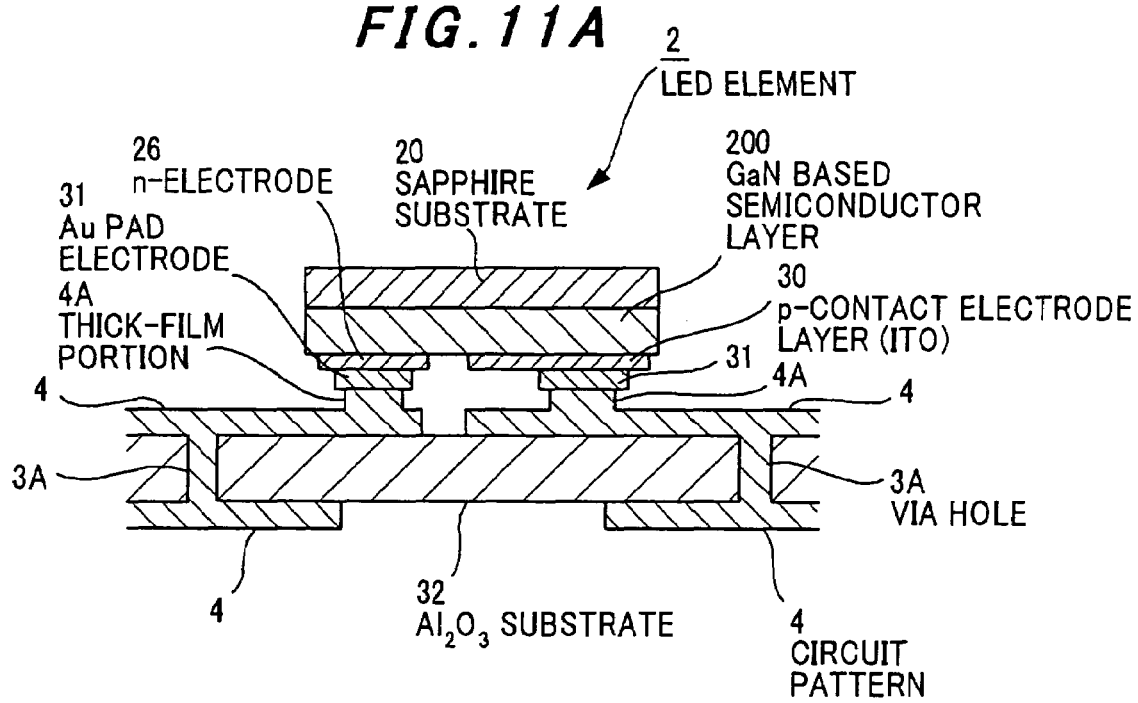
FIG. 11A is a cross sectional view showing an LED element (mounted on an $Al_2O_3$ substrate 32) in an eighth preferred embodiment according to the invention.
Figure 11B:
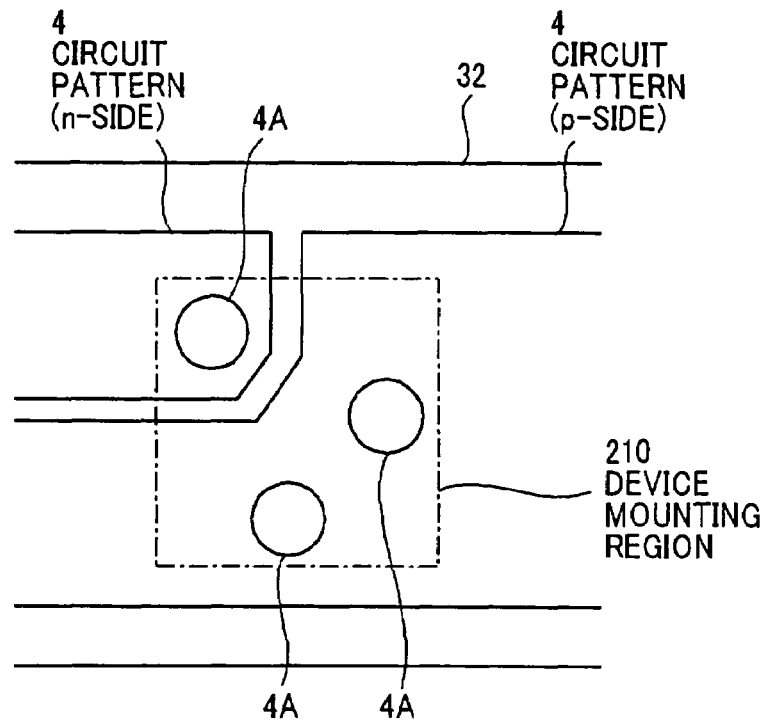
FIG. 11B is a plain view showing the $Al_2O_3$ substrate 32 in FIG. 11A with a circuit pattern formed thereon.

FIG. 11A is a cross sectional view showing an LED element (mounted on an Al$_2$O$_3$ substrate 32) in the eighth preferred embodiment according to the invention. FIG. 11B is a plain view showing the Al$_2$O$_3$ substrate 32 in FIG. 11A with a circuit pattern formed thereon.

In the eighth embodiment, as shown in FIG. 11A, a thick-film portion 4A of Ni is, by electroless deposition, formed 15 μm thick integrated with the circuit pattern 4 formed on the Al$_2$O$_3$ substrate 32. The thick-film portion 4A is provided with a 0.5 μm thick Au layer (not shown) formed on the Ni surface thereof.

Meanwhile, the LED element 2 is not provided with the Au stud bump 5. The other components are the same as in the sixth embodiment and the explanations thereof is omitted.

Effects of the Eighth Embodiment

In the eighth embodiment, the thick-film portion 4A of Ni formed by electroless deposition in place of the Au stud bump 5 is integrated with the circuit pattern 4. Therefore, adding to the effects of the sixth embodiment, the joint portion can be integrally formed. Especially when the multiple joint portions are used as shown in FIG. 11B, the positioning or posture control of the joint portions to a device mounting region 210 can be made easier as well as eliminating the process of forming the Au stud bump 5. Thus, the mass productivity of the light emitting device 1 can be enhanced.

Ninth Embodiment (Composition of LED Element 2)

Figure 12B:
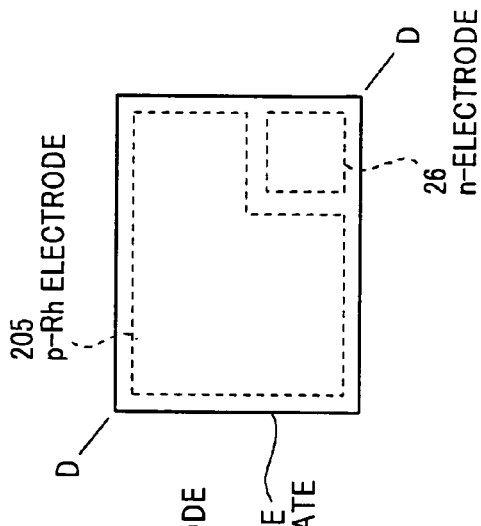
FIG. 12B is a plain view showing the LED element in FIG. 12A.
Figure 12A:
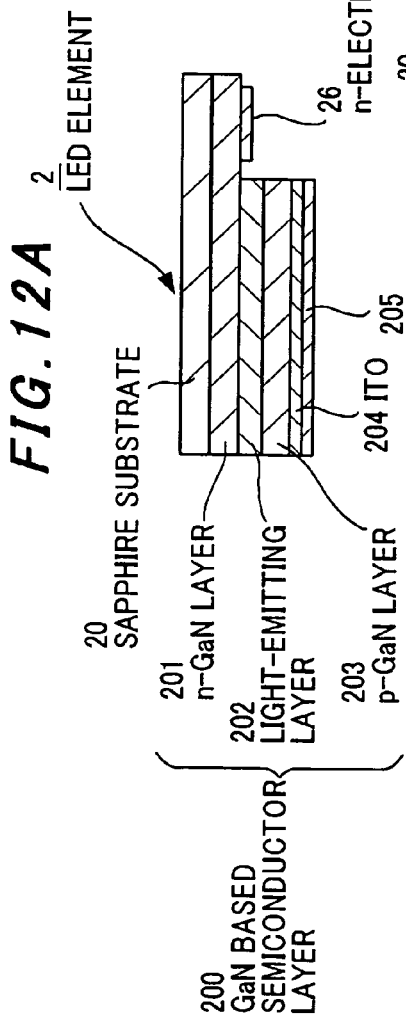
FIG. 12A is a cross sectional view showing an LED element in a ninth preferred embodiment according to the invention.
Figure 12C:
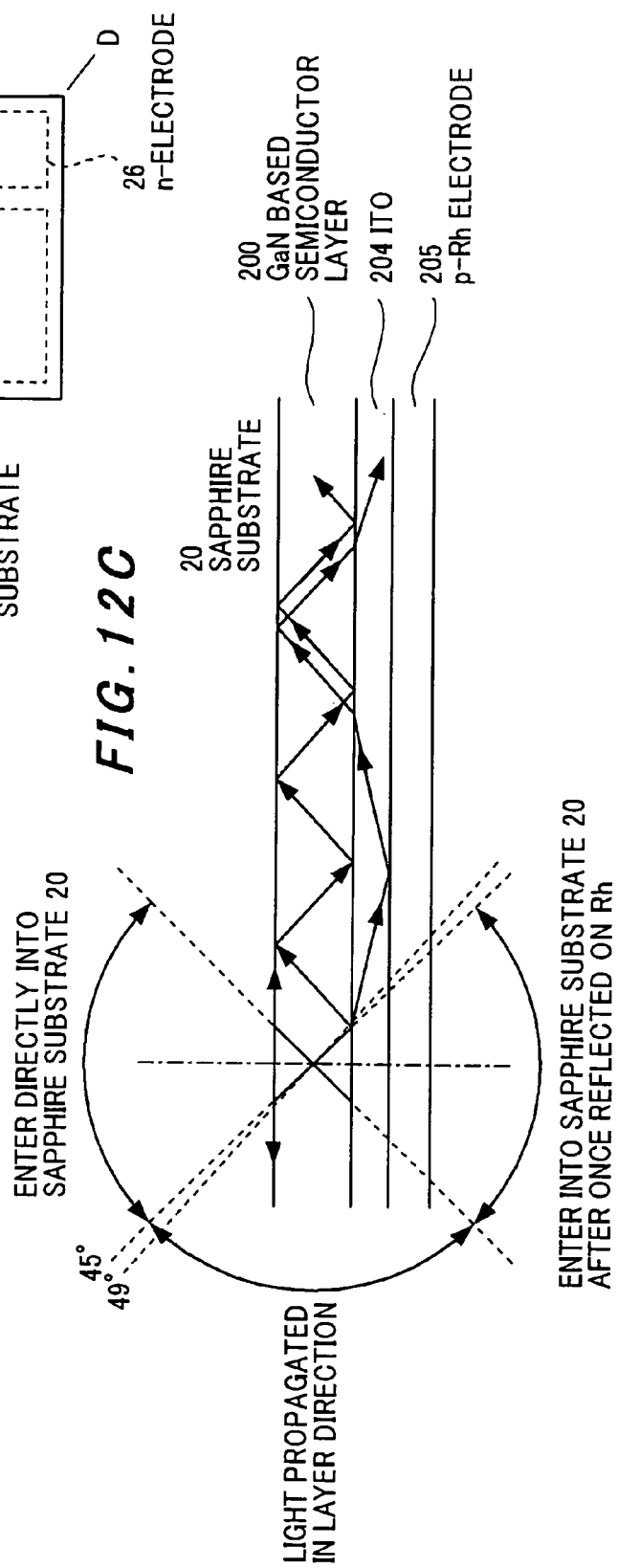
FIG. 12C is a diagram illustrating critical angles.

FIG. 12A is a cross sectional view showing an LED element in the ninth preferred embodiment according to the invention. FIG. 12B is a plain view showing the LED element in FIG. 12A. FIG. 12C is a diagram illustrating critical angles.

The flip-chip type LED element 2 is, as shown in FIG. 12A, composed of: the sapphire substrate 20; an n-GaN layer 201 made of a GaN based semiconductor compound; a light-emitting layer 202 formed on the n-GaN layer 201; a p-GaN layer 203; an n-electrode 26 that is formed on part of the n-GaN layer 201 exposed by removing the p-GaN layer 203 through the n-GaN layer 201 by etching; ITO (indium tin oxide) 240 that is formed on the p-GaN layer 203 and has a refractive index (n=1.8) lower than the GaN based semiconductor (n=2.4); and a p-Rh electrode 205 made of rhodium with a high-refractive index. The n-GaN layer 201, the light-emitting layer 202 and the p-GaN layer 203 compose the GaN based semiconductor layer 200. An Au pad electrode layer (not shown) for bump-bonding in the mounting is partially formed on a given bonding position of the p-Rh electrode 205.

In the ninth embodiment, the sapphire substrate 20 serves as a light transmitting portion that has a light transmission characteristic to an emission wavelength of blue light emitted from the light-emitting layer 202. The ITO 204 and the p-Rh electrode 205 are disposed on the mounting surface side located under the light-emitting layer 202 and compose a light reflection portion where the end face of the LED element 2 is exposed. The ITO 204 functions as a conductive total-reflection layer while having a light transmitting characteristic.

The GaN based semiconductor layer can be formed by the known method, i.e., metalorganic chemical vapor deposition (MOCVD), molecular beam epitaxy (MBE), hydride vapor phase epitaxy (HVPE), sputtering, ion plating, electron shower etc. The LED element 2 can be formed as a homo-, hetero- or double hetero-structure. The LED element 2 can include quantum well structure (single- or multi-quantum well structure).

FIG. 12B is a plain view showing the LED element 2, where FIG. 12A corresponds to a cross section cut along a line D-D. As shown, the p-Rh electrode 205 is formed surrounding the n-electrode 26 and the light-emitting layer 202 emits light in the region where the p-Rh electrode 205 is formed.

FIG. 12C is a diagram showing the behavior of blue light inside the GaN based semiconductor layer 200 of the ninth embodiment. Of light emitted from the light-emitting layer 202 in the GaN based semiconductor layer 200, a light component to enter into the interface between the sapphire substrate 20 and the GaN based semiconductor layer 200 at an angle greater than a critical angle based on the difference of refractive indexes thereof is not externally radiated and retained in the GaN based semiconductor layer 200 as a light propagated in the layer direction. The light propagated in the layer direction is propagated while reflected between the ITO 204 and the sapphire substrate 20 or between the p-Rh electrode 205 and the sapphire substrate 20. Most of the light is propagated in the layer direction without reaching the p-Rh electrode 205 due to the ITO 204.

Effects of the Ninth Embodiment

In the ninth embodiment, since the ITO 204 with a thermal expansion coefficient equal to the semiconductor layer is disposed between the p-GaN layer 203 and the p-Rh electrode 205, the electrode layer is unlikely to be separated from the p-GaN layer 203.

Further, the light propagated in the layer direction that enters into the interface at an angle greater than a critical angle based on the refractive index ratios of the GaN and ITO to the p-Rh electrode 205 is subjected to the total reflection. Therefore, it does not reach the p-Rh electrode 205 and is retained in the layer without being externally radiated from the GaN based semiconductor layer 200. Thereby, the metal absorption loss generated when the light propagated in the layer direction is reflected on the p-Rh electrode 205 can be prevented. This can prevent the attenuation of the light propagated in the layer direction at the short distance.

Although in FIG. 12A the GaN layer is illustrated thick for the explanation, it is in fact a thin film of several microns. Because of this, the light propagated in the layer direction has a great average number of reflections. Even when a metal with a high reflectivity of 90% is used, the influence by absorption loss must be much. Thus, the absorption loss can be significantly reduced.

As such, the light propagated in the layer direction reflected between the sapphire substrate 20 and the ITO 204 can be externally radiated from the side face of the LED element 2. The external radiation efficiency can be thus enhanced.

Although in the ninth embodiment the ITO 204 of transparent dielectric is disposed as a low-refractive index layer between the GaN based semiconductor layer 200 and the p-Rh electrode 205, the other low-refractive index layer such as InGaN (n=2.1), $In_2O_3$—$SnO_2$:90-10 wt %, and AZO(ZnO:Al)—IZO($In_2O_3$—ZnO):90-10 wt % may be used. However, it is preferred that a lower-refractive index material is chosen so as to increase the light propagated in the layer direction based on the total reflection.

The ITO has a bonding force to the GaN greater than the Rh. Further, the surface of the ITO formed is roughened. Therefore, the bonding force of the Rh to the ITO increases.

Therefore, the separation of the electrode layer is more unlikely to occur as compared to the Rh layer directly bonded to the GaN.

Also, the high-reflectivity material used as the p-electrode is not limited to the Rh, and the other material such as Ag may be used. However, it should be noted that the film thickness is not increased more than necessary in the case of a material with a large thermal expansion coefficient.

Alternatively, when the mount surface for the flip-chip mounting of the LED element 2 has a high reflectivity, the high-reflectivity material may be omitted without using the above combination of the transparent dielectric and the high-reflectivity material. For example, in the case of GaAs based compound semiconductor, a Bragg reflection film composed of a multilayer with different refractive-index materials can be used when the high-reflectivity material is omitted.

Although in the ninth embodiment the LED element 2 is composed of the GaN based semiconductor layer 200 grown on the sapphire substrate 20, the LED element 2 may have a GaN substrate or the sapphire substrate 20 may be lifted off after the growth of he GaN based semiconductor layer 200. Even in the case of lifting off the sapphire substrate 20, it is substantially included in the form that the semiconductor layer is formed on the sapphire substrate 20 and light emitted from a corresponding light-emitting layer is externally discharged. Further, the LED element 2 may be made of a material other than GaN.

Tenth Embodiment (Composition of LED Element 2)

Figure 13:
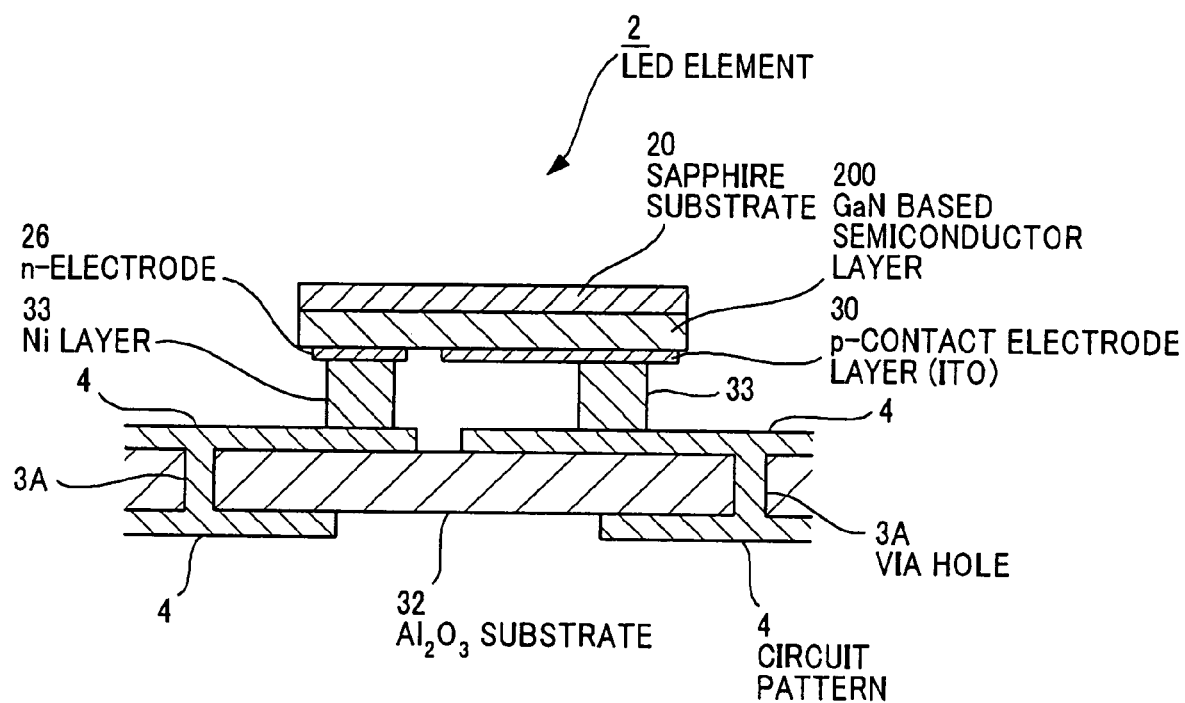
FIG. 13 is a cross sectional view showing an LED element (mounted on an $Al_2O_3$ substrate 32) in a tenth preferred embodiment according to the invention.

FIG. 13 is a cross sectional view showing an LED element (mounted on an $Al_2O_3$ substrate 32) in the tenth preferred embodiment according to the invention.

In this embodiment, instead of the Au stud bump 5 used in the sixth embodiment, a Ni layer 33 is formed 15 μm thick by electroless plating on the circuit pattern 4 formed on the surface of the $Al_2O_3$ substrate 32. An Au layer (not shown) is formed 0.5 μm thick on the surface of the Ni layer 33.

Effects of the Tenth Embodiment

In the tenth embodiment, since the thick Ni layer 33 is integrally formed by electroless plating on the side of the LED element 2, the thick portion can be easily made according to the shape of the n-electrode 26 and the p-contact electrode layer 30. Thereby, the performance of fabrication can be enhanced. Also, the mounting property can be enhanced by the Ni layer 33 formed on the side of the LED element 2 where a high precision is needed in positioning the circuit pattern 4 and the LED element 2. Thereby, the yield can be enhanced.

Eleventh Embodiment (Composition of LED Element 2)

Figure 14:
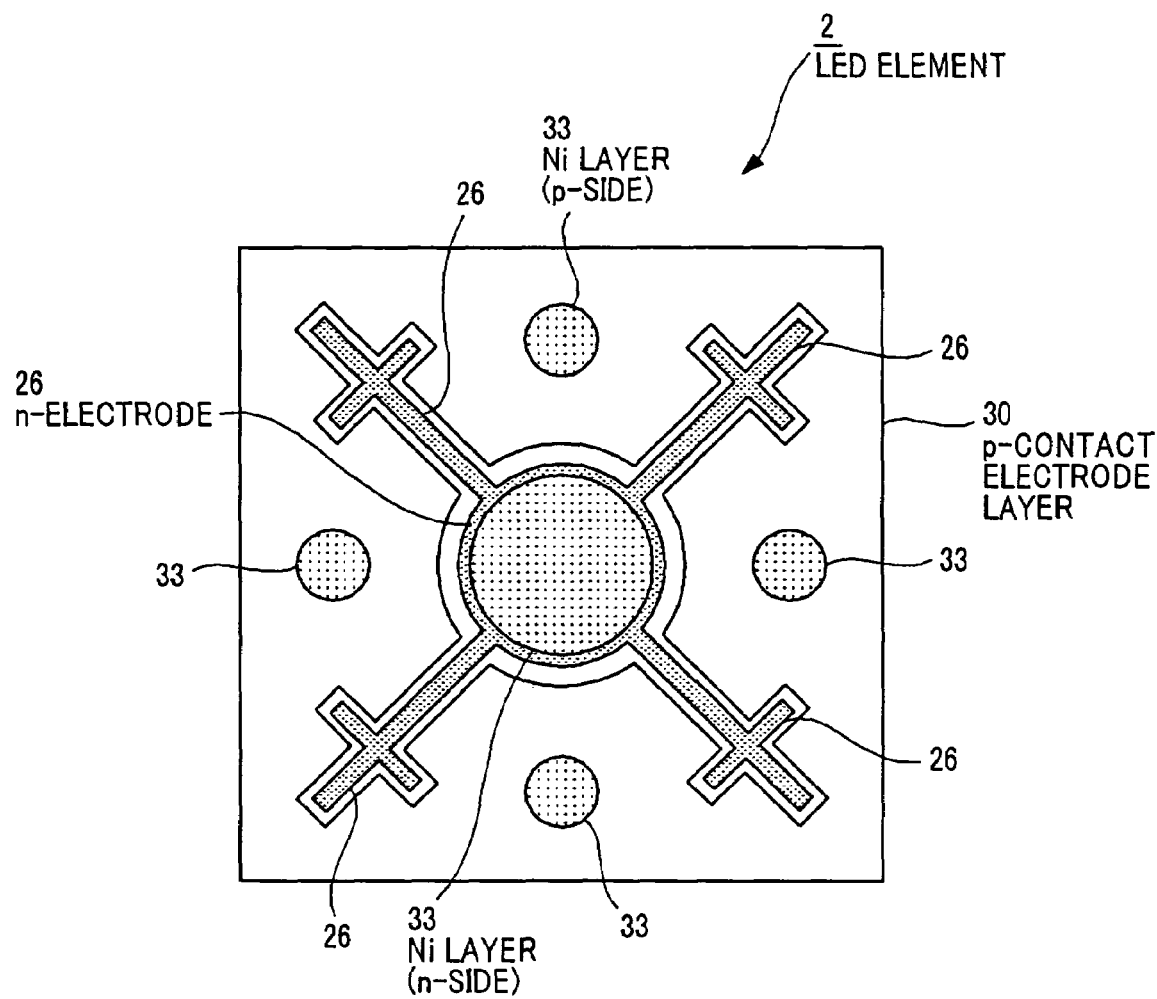
FIG. 14 is a plain view showing an LED element (viewed from its electrode forming surface) in an eleventh preferred embodiment according to the invention.

FIG. 14 is a plain view showing an LED element (viewed from its electrode forming surface) in the eleventh preferred embodiment according to the invention.

In the eleventh embodiment, an n-electrode 26 is formed radially from the center of the LED element 2, and the p-contact electrode layer 30 is formed on the p-GaN layer surrounding the n-electrode 26. The Ni layer 33 explained in the ninth embodiment is formed on the n-electrode 26 and the p-contact electrode layer 30. The n-electrode 26 is formed radially on part of the n-GaN layer exposed by removing the p-GaN layer by etching in the diagonal direction of the electrode forming surface. Thereby, the current spreading property to the p-GaN layer can be enhanced.

Effects of the Eleventh Embodiment

In the eleventh embodiment, adding to the effects of the ninth embodiment, the current spreading property can be enhanced by the n-electrode 26 formed radially from the center of the LED element 2.

The Ni layer 33 formed by electroless plating has a degree of freedom in its dimensions. Therefore, the mounting pad electrodes (the Ni layer 33) can be formed at a suitable position and in a suitable form even when the electrode pattern is formed as described above. In detail, the n-electrode pad 33 is disposed at the center of the LED element 2, and the p-electrode pads 33 are disposed on four sites of the p-contact electrode layer 30 so as to have the stability in the mounting, and they are downsized so as to prevent the short-circuit to the n-electrode 26 formed radially even when deformed slightly in the mounting.

Twelfth Embodiment (Composition of LED Element 2)

FIG. 15 is a plain view showing an LED element (viewed from its electrode forming surface) in the twelfth preferred embodiment according to the invention.

In the twelfth embodiment, the Ni layer 33 is formed on the n-electrode 26, and a plurality of rectangular (or square) Ni layers 33 are, at given intervals like islands, formed on the p-contact electrode layer 30 except the n-electrode 26.

Effects of the Twelfth Embodiment

In the twelfth embodiment, adding to the tenth embodiment, the bonding area of the p-contact electrode layer 30 to the circuit pattern 4 can be increased. Thereby, the current-carrying property and the heat radiation property of the LED element 2 can be enhanced. In this case, since the Ni layer 33 (mounting pads) with a large thermal expansion coefficient is formed not continuously but like islands relative to the other components, the thermal stress generated at a high temperature can be reduced.

The solid-state element devices as explained above are applied to the light emitting device 1 using the LED element 2 as a solid-state element. However, the solid-state element or the solid-state element device of the invention is not limited to the light emitting device 1. For example, it may be applied to a solid-state element device that a light-receiving element as a solid-state element is mounted on a substrate and sealed with glass. The seal material is not limited to a transparent material and may be an inorganic material that is slightly clouded by crystallization as well as having a light transmitting characteristic. Further, it may be a resin material other than the inorganic material if it can endure at a temperature where a thermal stress such as reflowing can be a problem.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A solid-state element, comprising:
a semiconductor layer formed on a substrate, the semiconductor layer comprising a first layer that corresponds to an emission area of the solid-state element and a second layer through which current is supplied to the first layer;
a light discharge surface through which light emitted from the first layer is externally discharged, the light discharge surface being located on the side of the substrate;
a contact electrode layer with a thermal expansion coefficient substantially equal to the solid-state element; and
a joint portion that is formed partially on the contact electrode layer and is connected to an external wiring portion.

2. The solid-state element according to claim 1, wherein: the joint portion comprises nickel (Ni).

3. The solid-state element according to claim 1, wherein: the semiconductor layer comprises a light-emitting layer to emit light based on current supplied thereto.

4. The solid-state element device according to claim 1, wherein: the solid-state element comprises a flip-chip type element.

5. The solid-state element device according to claim 1, wherein: the solid-state element is sealed with an inorganic material.

6. The solid-state element device according to claim 5, wherein: the inorganic seal portion comprises glass.

7. A solid-state element device, comprising:
a solid-state element comprising: a semiconductor layer formed on a substrate, the semiconductor layer comprising a first layer that corresponds to an emission area of the solid-state element and a second layer through which current is supplied to the first layer; and a light discharge surface through which light emitted from the first layer is externally discharged, the light discharge surface being located on the side of the substrate;
a contact electrode layer with a thermal expansion coefficient substantially equal to the solid-state element;
a joint portion that is formed on the contact electrode layer and is connected to an external wiring portion;
a mount substrate on which the solid-state element is mounted, the mount substrate having a thermal expansion coefficient substantially equal to the solid-state element; and
an inorganic seal portion that seals the solid-state element.

8. The solid-state element device according to claim 7, wherein:
the joint portion is formed partially on the contact electrode layer.

9. The solid-state element device according to claim 7, wherein:

the inorganic seal portion comprises a glass material with a thermal expansion coefficient substantially equal to the substrate.

10. The solid-state element device according to claim 7, wherein:

the contact electrode layer comprises a conductive metal oxide.

11. The solid-state element device according to claim 10, wherein:

the conductive metal oxide comprises ITO.

12. The solid-state element device according to claim 7, wherein: the solid-state element is a flip-chip mounted on the mount substrate.

13. The solid-state element device according to claim 7, wherein: the inorganic seal portion comprises glass.

14. The solid-state element according to claim 7, wherein: the mount substrate comprises an inorganic material.

* * * * *